(12) United States Patent
Komatsu et al.

(10) Patent No.: US 8,575,978 B2
(45) Date of Patent: Nov. 5, 2013

(54) SEMICONDUCTOR DEVICE, ELECTRONIC DEVICE, AND METHOD OF TESTING THE SEMICONDUCTOR DEVICE

(75) Inventors: Danichi Komatsu, Itami (JP); Wataru Tanaka, Itami (JP); Satoru Ikeda, Itami (JP); Yayoi Nagao, Itami (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/462,716

(22) Filed: May 2, 2012

(65) Prior Publication Data

US 2012/0306540 A1    Dec. 6, 2012

(30) Foreign Application Priority Data

May 31, 2011   (JP) .................................. 2011-122078

(51) Int. Cl.
*H03L 7/00*   (2006.01)
(52) U.S. Cl.
USPC .............. 327/143; 327/530; 327/565; 327/89
(58) Field of Classification Search
USPC .......... 327/77, 72, 56, 60, 68, 74, 78, 80, 81, 327/82, 88, 89, 90, 142, 143, 198, 530, 538, 327/544, 545, 548, 564, 583, 594, 325, 327/565; 307/91; 361/79, 86, 88, 90, 92
See application file for complete search history.

(56) References Cited

U.S. PATENT DOCUMENTS 4,175,256 A * 11/1979 Dolikian ......................... 327/61
4,308,567 A * 12/1981 Mark ............................. 361/187
4,652,774 A *  3/1987 Hasegawa ..................... 327/178

FOREIGN PATENT DOCUMENTS

JP      11-237441 A     8/1999
JP    2005-322768 A    11/2005

* cited by examiner

*Primary Examiner* — Lincoln Donovan
*Assistant Examiner* — Jung H. Kim
(74) *Attorney, Agent, or Firm* — McGinn IP Law Group, PLLC

(57) ABSTRACT

A coupling failure of a supply terminal or a ground terminal is easily detected. A diode is disposed between a supply terminal of a semiconductor device and a first I/O terminal so that the supply terminal is located on a cathode side, and the first I/O terminal is located on an anode side. A determination unit determines whether or not a voltage of the supply terminal is lower than a voltage of the first I/O terminal when a signal of high level equal to a supply voltage is input to the first I/O terminal.

8 Claims, 31 Drawing Sheets

SEMICONDUCTOR DEVICE, ELECTRONIC DEVICE, AND METHOD OF TESTING THE SEMICONDUCTOR DEVICE

CROSS-REFERENCE TO RELATED APPLICATIONS

The disclosure of Japanese Patent Application No. 2011-122078 filed on May 31, 2011 including the specification, drawings, and abstract is incorporated herein by reference it its entirety.

BACKGROUND

The present invention relates to a semiconductor device in which multiple elements are integrated on a semiconductor substrate, and an electronic device having the semiconductor device mounted thereon, and more particularly to a method of testing an open failure of a supply terminal or a ground terminal disposed on the semiconductor device.

As a technique for testing the open failure of the supply terminal or the ground terminal, for example, a method disclosed in Japanese Patent Unexamined Application Publication No. Hei 11(1999)-237441 has been known. This publication discloses a technique of testing whether or not all of multiple supply terminals or ground terminals disposed on a semiconductor package are normally coupled to joint portions on a printed circuit board. More specifically, there is provided a detector for electrically detecting a coupling state of multiple the terminals on the semiconductor package to multiple the joint portions on the printed circuit board, which face the respective terminals.

The same technique is disclosed in Japanese Patent Unexamined Application Publication No. 2005-322768. An (large scale integration) chip disclosed in this publication includes multiple pads, an internal wiring coupled to the pads, a monitor circuit coupled to the pads, and a detector circuit coupled to the monitor circuit. The monitor circuit outputs multiple measurement signals indicative of values corresponding to the respective potentials of those pads to the detector circuit. The detector circuit detects differences of the potentials among the plural pads on the basis of input measurement signals.

SUMMARY

The above publications relate to a method of detecting partial terminals subjected to coupling failure when the plural supply terminals and the plural ground terminals are provided. Even if only one supply terminal and only one ground terminal are provided, the detection of the coupling failure may not be easy.

More specifically, when a supply voltage is applied to one of I/O ports even if the coupling of any supply terminal is in failure, the semiconductor chip may seemingly operate normally. This is because the supply voltage is applied to a supply wiring within the semiconductor chip through a diode parasitic in a PMOS (positive-channel metal oxide semiconductor) transistor configuring an output buffer.

Likewise, when a ground voltage is applied to one of I/O ports even if the coupling of any ground terminal is in failure, the semiconductor chip may seemingly operate normally. This is because the ground voltage is applied to a ground wiring within the semiconductor chip through a diode parasitic in an NMOS (negative-channel metal oxide semiconductor) transistor configuring the output buffer.

If the coupling of the I/O terminal of the signal is in failure, it is tested whether or not the semiconductor device normally operates in response to input and output signals so that the coupling failure can be easily detected. However, when the open failure occurs, if the semiconductor chip operates at a low load, the coupling failure cannot be easily detected because the semiconductor chip seemingly operates normally.

A main object of the present invention is to provide a semiconductor device that can easily detect the coupling failure of the supply terminal or the ground terminal.

According to an aspect of the present invention, there is provided a semiconductor device including a supply terminal, a ground terminal, a first I/O terminal, a first diode, and a determination unit. The supply terminal is disposed to receive a supply voltage from the external. The ground terminal is disposed to receive a ground voltage from the external. The first I/O terminal is disposed to conduct at least one of input and output of a signal with respect to the external. The first diode is disposed between the supply terminal and the first I/O terminal so that the supply terminal is located on a cathode side and the first I/O terminal is located on an anode side. The determination unit determines whether or not a voltage at the supply terminal is lower than a voltage at the first I/O terminal when a signal of high level equal to the supply voltage is input to the first I/O terminal.

According to the aspect of the semiconductor device, the coupling failure of the supply terminal or the ground terminal can be easily detected by provision of the determination unit.

DETAILED DESCRIPTION

Figure 1:
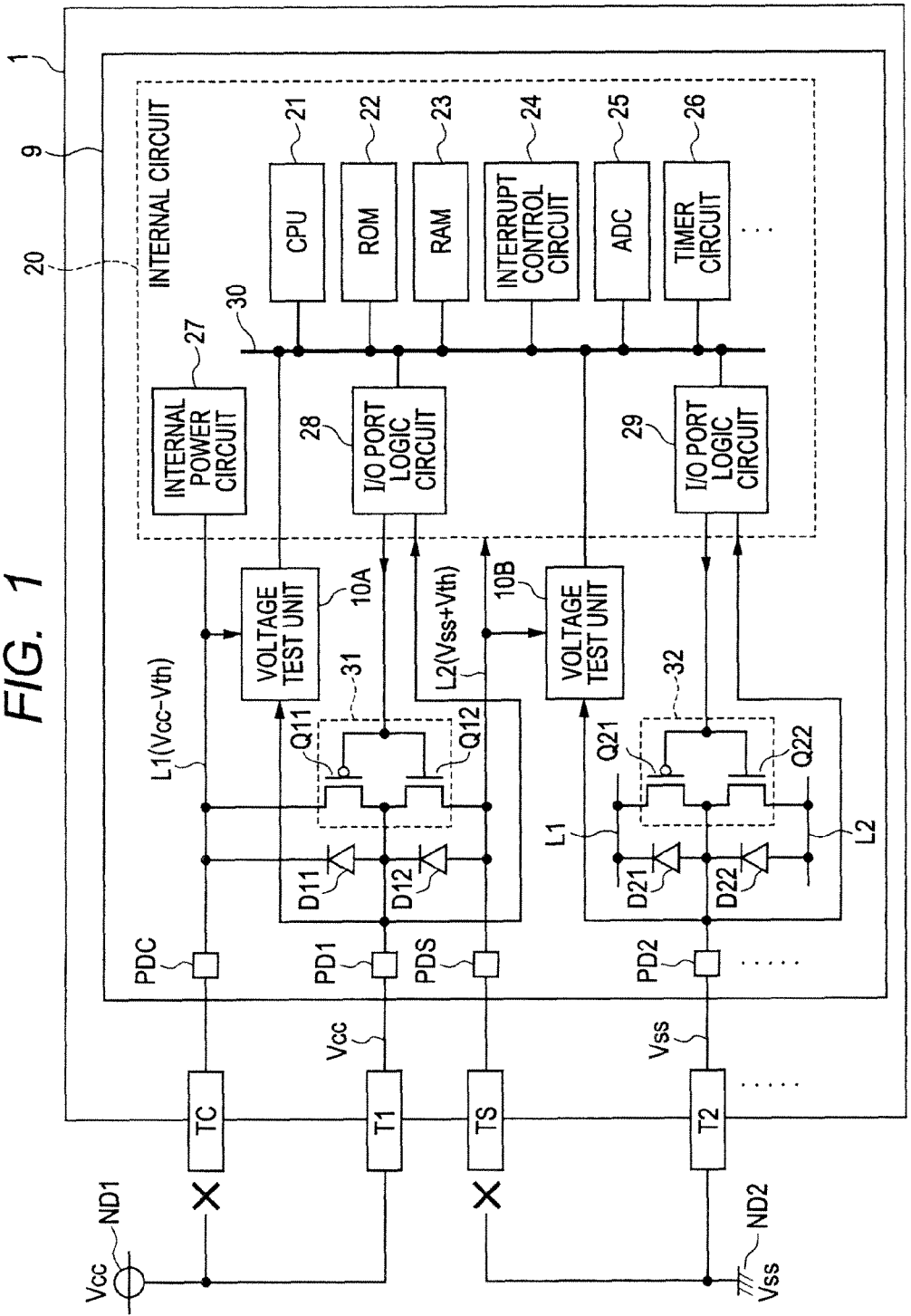
FIG. 1 is a block diagram illustrating a configuration of a semiconductor device according to a first embodiment of the present invention.

Hereinafter, embodiments of the present invention will be described in detail with reference to the accompanying drawings. The same or corresponding parts are denoted by identical reference numerals or symbols, and their description will not be repeated.

First Embodiment

Configuration of Semiconductor Device

FIG. 1 is a block diagram illustrating a configuration of a semiconductor device according to a first embodiment of the present invention. Referring to FIG. 1, the semiconductor device has a semiconductor chip 9 accommodated in a semiconductor package 1. The semiconductor chip 9 includes multiple pads PDC, PDS, PD1, PD2, . . . , an internal circuit 20, output buffers 31, 32, and voltage test units 10A, 10B. In FIG. 1, a microcomputer chip is exemplified as the semiconductor chip 9.

The semiconductor package 1 includes a supply terminal TC for receiving a supply voltage Vcc from the external, a ground terminal TS for receiving a ground voltage Vss from the external, and multiple I/O terminals T1, T2, . . . used for inputting and outputting a signal. Pads PDC, PDS, PD1, PD2, . . . disposed on a periphery edge of the semiconductor chip are coupled to the supply terminal TC, the ground terminal TS, and the I/O terminals T1, T2, . . . , through bonding wires, respectively. The semiconductor package 1 may be of any type such as a QFP (quad flat package) or BGA (ball grid array). In the case of a QFP, the above respective terminals correspond to lead frames.

The internal circuit 20 includes a large number of functional blocks such as a CPU (central processing unit) 21, a ROM (read only memory) 22 (for example, flash memory), a RAM (random access memory) 23, an interrupt control circuit 24, an ADC (analog-to-digital converter) 25, a timer circuit 26, and I/O (input/output) port logic circuits 28, 29. Those functional blocks are coupled to each other through a bus 30. The I/O (input/output) port logic circuits 28 and 29 are interfaces used when input or output (at least one of input and output) of data is conducted between the internal circuit 20 such as the CPU 21 and the external of the semiconductor device through the pads PD1 and PD2. For example, the I/O (input/output) port logic circuits 28 and 29 temporarily hold input or output data, and convert a signal format or a voltage level.

The internal circuit 20 further includes an internal power circuit 27. The internal power circuit 27 is coupled to the pad PDC through a supply wiring L1. The internal power circuit 27 generates an internal power supply on the basis of the supply voltage Vcc received through the pad PDC, and applies the generated internal power supply to the respective functional blocks within the internal circuit 20 as drive voltages. The respective functional blocks of the internal circuit 20 are coupled to the pad PDS through a ground wiring L2, and receive the ground voltage Vss from the external.

The output buffer 31 receives an output data signal from the IO (input/output) port 28, and enhances the output data signal to output the enhanced output data signal to the external through the PD1. In more detail, the output buffer 31 includes a PMOS transistor Q11 coupled between the supply wiring L1 and the pad PD1, and an NMOS transistor Q12 coupled between the ground wiring L2 and the pad PD1. An output data signal output from the IO (input/output) port 28 is input to gates of the transistors Q11 and Q12.

Usually, parasitic diodes D11 and D12 are disposed in parallel to the MOS transistors Q11 and Q12, respectively. More specifically, the pad PDC (supply terminal TC) is disposed on a cathode side of the parasitic diode D11, and the pad PD1 (I/O terminal T1) is disposed on an anode side of the parasitic diode D11. The pad PDS (ground terminal TS) is disposed on an anode side of the parasitic diode D12, and the pad PD1 (I/O terminal T1) is disposed on a cathode side of the parasitic diode D12. Those parasitic diodes D11 and D12 internally have a function of an electrostatic protection. If the pad PD1 is used for only input, because there is provided no output buffer 31, no parasitic diode occurring in the output buffer occurs. On the other hand, if the diodes D11 and D12 are provided for protection of the electrostatic discharge, the diodes D11 and D12 have the same function.

The same is applied to the output buffer 32. If schematically described, the output buffer 32 receives an output data signal output from the I/O port logic circuit 29, enhances the output data signal, and outputs the enhanced output data signal to the external through the pad PD2. In more detail, the output buffer 32 includes a PMOS transistor Q21 coupled between the supply wiring L1 and the pad PD2, and an NMOS transistor Q22 coupled between the ground wiring L2 and the pad PD2.

Parasitic diodes D21 and D22 are disposed in parallel to the MOS transistors Q21 and Q22, respectively. The parasitic diodes D21 and D22 are used for electrostatic protection.
(Detection of Open Failure)

When the semiconductor device is mounted on the printed circuit board, the terminals TC, TS, T1, and T2 of the semiconductor device are coupled to coupling portions on the printed circuit board by soldering. In this situation, when the supply voltage Vcc or the ground voltage Vss is applied to the I/O terminals T1 and T2, the coupling failure of the supply terminal TC and the ground terminal TS may not be easily detected. Hereinafter, a description will be given in detail of the detection of open failure with reference to FIG. 1.

First, a case in which the supply voltage Vcc is applied to the I/O terminal T1 will be described. For example, a case in which a signal of high level for determining an operation mode of the semiconductor device is fixedly input to the I/O terminal T1, and a case in which the I/O terminal T1 is coupled to a power node ND1 for prevention of a floating state when the I/O terminal T1 is unused, are applied to this example. If a coupling of the supply terminal TC to the external is disconnected because a solder joint of the supply terminal TC is in failure, the supply voltage Vcc (for example, 5[V]) input through the I/O terminal T1 is applied to the supply wiring L1 through the diode D11. A voltage of the supply wiring L1 is lower than the supply voltage Vcc by a built-in voltage Vth (about 0.7V) of the diode D11. Seemingly, the internal circuit 20 normally operates with a voltage (Vcc−Vth) as a drive voltage. However, since the amount of current is limited by a wiring resistance and the diode D11, the operation of the internal circuit 20 is unstable.

Subsequently, a description will be given of a case in which the ground voltage Vss is applied to the I/O terminal T2. For example, a case in which a signal of low level for determining the operation mode of the semiconductor device is fixedly input to the I/O terminal T2, and a case in which the I/O terminal T2 is coupled to a power node ND2 for prevention of a floating state when the I/O terminal T2 is unused, are applied to this example. If a coupling of the ground terminal TS to the external is disconnected because a solder joint of the ground terminal TS is in failure, the ground voltage Vss (for example, 0[V]) input through the I/O terminal T2 is applied to the ground wiring L2 through the diode D22. A voltage of the ground wiring L2 is higher than the ground voltage Vss by a built-in voltage Vth (about 0.7V) of the diode D22. Seemingly, the internal circuit 20 normally operates with a voltage (Vss+Vth). However, since the amount of current is limited by a wiring resistance and the diode D22, the operation of the internal circuit 20 is unstable.

Since seemingly, the internal circuit 20 normally operates, it is not easy to detect the above open failure. Under the circumstances, in the semiconductor device of FIG. 1, the voltage test units 10A and 10B are disposed for the purpose of easily detecting the above open failure.

The voltage test unit 10A determines whether or not a voltage of the supply wiring L1 coupled to the supply terminal TC is lower than a voltage of the pad PD1 coupled to the I/O terminal T1. If the voltage of the supply wiring L1 is lower than the voltage of the pad PD1 (specifically, lower by the built-in voltage Vth of the diode D11), it is determined that the coupling of the supply terminal TC is in failure. On the other hand, the voltage test unit 10B determines whether or not the voltage of the ground wiring L2 coupled to the ground terminal TS is higher than the voltage of the pad PD2 coupled to the I/O terminal T2. If the voltage of the ground wiring L2 is higher than the voltage of the pad PD2 (specifically, higher by the built-in voltage Vth of the diode D22), it is determined that the coupling of the ground terminal TS is in failure. In the present specification, the voltage test unit is also called "determination unit".
(Configuration of Voltage Test Units 10A and 10B)

Figure 2:
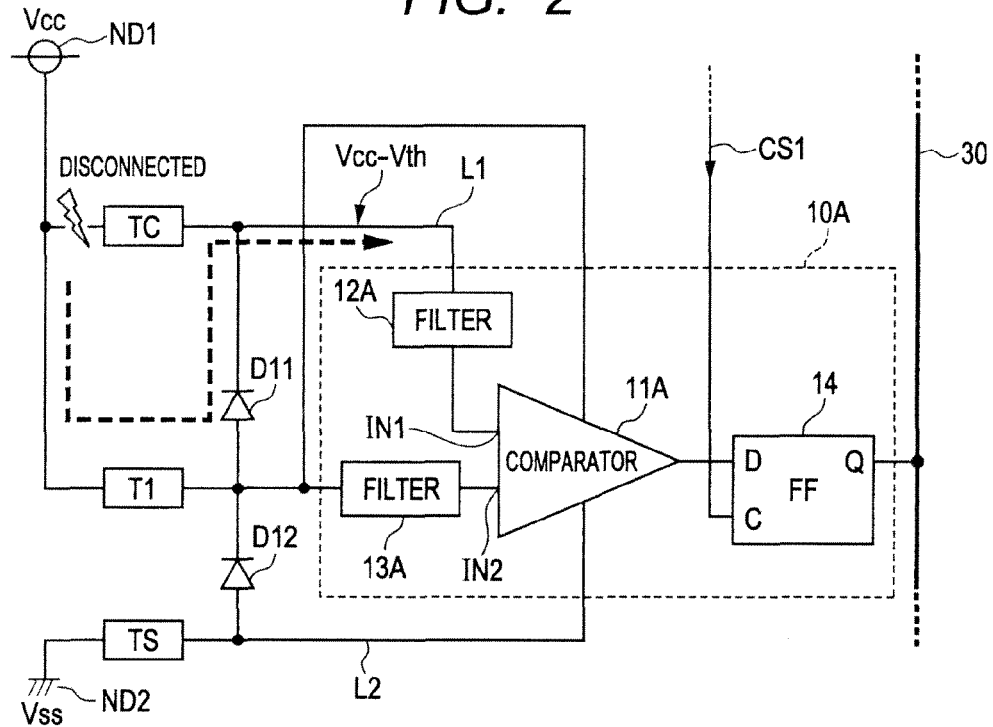
FIG. 2 is a circuit diagram illustrating a configuration of one voltage test unit in FIG. 1.

FIG. 2 is a circuit diagram illustrating a configuration of the voltage test unit in FIG. 1. FIG. 2 also illustrates the supply terminal TC, the ground terminal TS, the I/O terminal T1, the parasitic diodes D11, D12, and the bus 30 in FIG. 1 together.

Referring to FIG. 2, the voltage test unit 10A includes a comparator 11A, filters 12A, 13A for removing noise, and a D flip-flop 14. A first input node IN1 of the comparator 11A is coupled to the supply terminal TC through the filter 12A, and a second input node IN2 of the comparator 11A is coupled to the I/O terminal T1 through the filter 13A. An output node of the comparator 11A is coupled to a data terminal D of the D flip-flop 14.

The comparator 11A is driven by a voltage applied between the I/O terminal T1 and the ground terminal TS (ground wiring L2), and compares an input voltage (voltage of supply terminal TC) of the first input node IN1 with an input voltage (voltage of I/O terminal T1) of the second input node IN2. Then, the comparator 11A outputs a signal of a low (L) level ("0") when an input voltage (voltage of supply terminal TC) of the first input node IN1 is equal to or higher than an input voltage (voltage of I/O terminal T1) of the second input node IN2. On the other hand, the comparator 11A outputs a signal of a high (H) level ("1") when the input voltage (voltage of supply terminal TC) of the first input node IN1 is lower than the input voltage (voltage of I/O terminal T1) of the second input node IN2. An offset voltage of the comparator 11A is adjusted so that the output thereof becomes L level when voltages input to the first and second input nodes IN1 and IN2 are equal to each other.

Subsequently, the operation will be described. First, it is assumed that the solder joint of the supply terminal TC is in failure and disconnected. It is assumed that the supply voltage Vcc is input to the I/O terminal T1. In this situation, since the voltage of the supply wiring L1 becomes lower than the supply voltage Vcc by the built-in voltage Vth of the diode D11, the comparator 11A outputs a signal of the H level. On the other hand, if the solder joint of the supply terminal TC is normal, the supply voltage Vcc is input to the supply terminal TC and the I/O terminal T1. Accordingly, the comparator 11A outputs a signal of the L level.

If a control signal CS1 input to a clock terminal C rises to the H level, the D flip-flop 14 holds a logic level of the signal input to the data terminal D, and outputs the signal from an output terminal Q. For example, the CPU 21 in FIG. 1 acquires an output of the D flip-flop 14 through the bus 30 after changing the level of the control signal CS1 to the H level. The CPU 21 detects an abnormal coupling of the supply terminal TC due to a change in the level of the output signal from the D flip-flop 14 to the H level.

In the configuration of FIG. 2, the comparator 11A must not be driven by a voltage applied between the supply terminal TC (supply wiring L1) and the ground terminal TS (ground wiring L2). This is because when the coupling of the supply terminal TC is in failure, the input voltage (Vcc) to the second input node IN2 is higher than the drive voltage (Vcc−Vth) of the comparator 11A at a higher voltage side.

Figure 3:
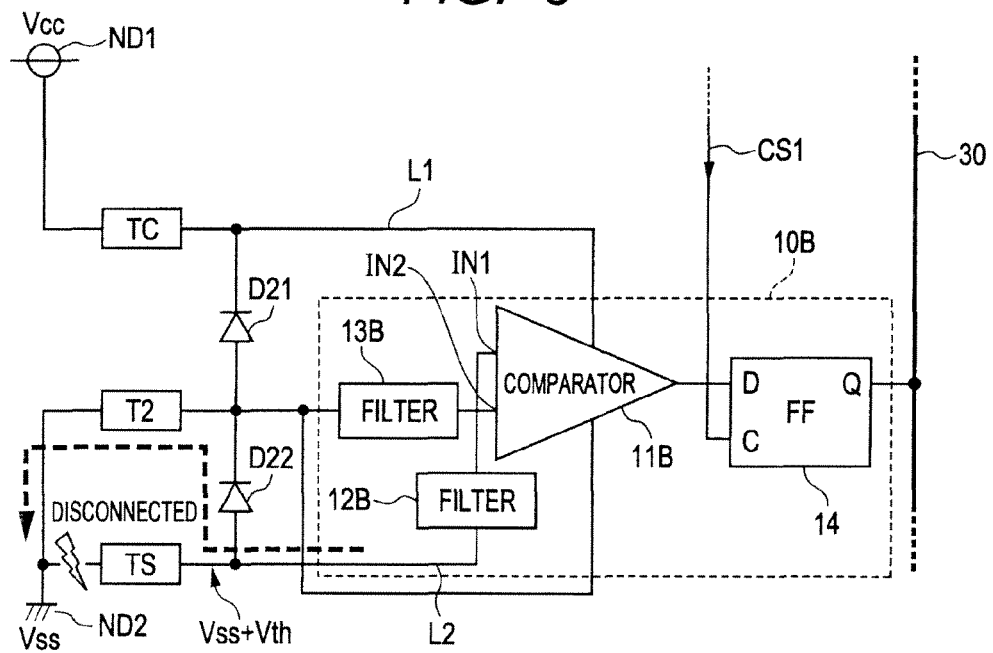
FIG. 3 is a circuit diagram illustrating a configuration of another voltage test unit in FIG. 1.

FIG. 3 is a circuit diagram illustrating a configuration of the voltage test unit 10B in FIG. 1. FIG. 2 also illustrates the supply terminal TC, the ground terminal TS, the I/O terminal T2, the parasitic diodes D21 and D22, and the bus 30 in FIG. 1 together.

Referring to FIG. 3, the voltage test unit 10B includes a comparator 11B, filters 12B, 13B for removing noise, and the D flip-flop 14. The first input node IN1 of the comparator 11B is coupled to the ground terminal TS through the filter 12B, and the second input node 1N2 of the comparator 11B is coupled to the I/O terminal T2 through the filter 13B. An output node of the comparator 11B is coupled to the data terminal D of the D flip-flop 14.

The comparator 11B is driven by a voltage applied between the supply terminal TC (supply wiring L1) and the I/O terminal T2, and compares an input voltage (voltage of ground terminal TS) of the first input node IN1 with an input voltage (voltage of I/O terminal T2) of the second input node IN2. Then, the comparator 11B outputs a signal of the low (L) level ("0") when an input voltage (voltage of ground terminal TS) of the first input node IN1 is equal to or lower than an input voltage (voltage of I/O terminal T2) of the second input node IN2. On the other hand, the comparator 11B outputs a signal of the H level ("1") when the input voltage (voltage of ground terminal TS) of the first input node IN1 is higher than the input voltage (voltage of I/O terminal T2) of the second input node IN2. An offset voltage of the comparator 11B is adjusted so that the output thereof becomes L level when voltages input to the first and second input nodes IN1 and IN2 are equal to each other.

Subsequently, the operation will be described. First, it is assumed that the solder joint of the ground terminal TS is in failure and disconnected. It is assumed that the ground voltage Vss is input to the I/O terminal 12. In this situation, since the voltage of the supply wiring L1 becomes higher than the ground voltage Vss by the built-in voltage Vth of the diode D22, the comparator 11B outputs a signal of the H level. On the other hand, if the solder joint of the ground terminal TS is normal, the ground voltage Vss is input to the ground terminal TS and the I/O terminal T2. Accordingly, the comparator 11B outputs a signal of the L level.

If the control signal CS1 input to the clock terminal C rises to the H level, the D flip-flop 14 holds a logic level of the signal input to the data terminal D, and outputs the signal from the output terminal Q. For example, the CPU 21 in FIG. 1 acquires the output of the D flip-flop 14 through the bus 30 after changing the level of the control signal CS1 to the H level. The CPU 21 detects the abnormal coupling of the ground terminal TS due to a change in the level of the output signal from the D flip-flop 14 to the H level.

In the configuration of FIG. 2, the comparator 11B must not be driven by a voltage applied between the supply terminal TC (supply wiring L1) and the ground terminal TS (ground wiring L2). This is because when the coupling of the ground terminal TS is in failure, the input voltage (Vss) to the second input node IN2 is lower than the drive voltage (Vss+Vth) of the comparator 11B at a lower voltage side.

Figure 4:
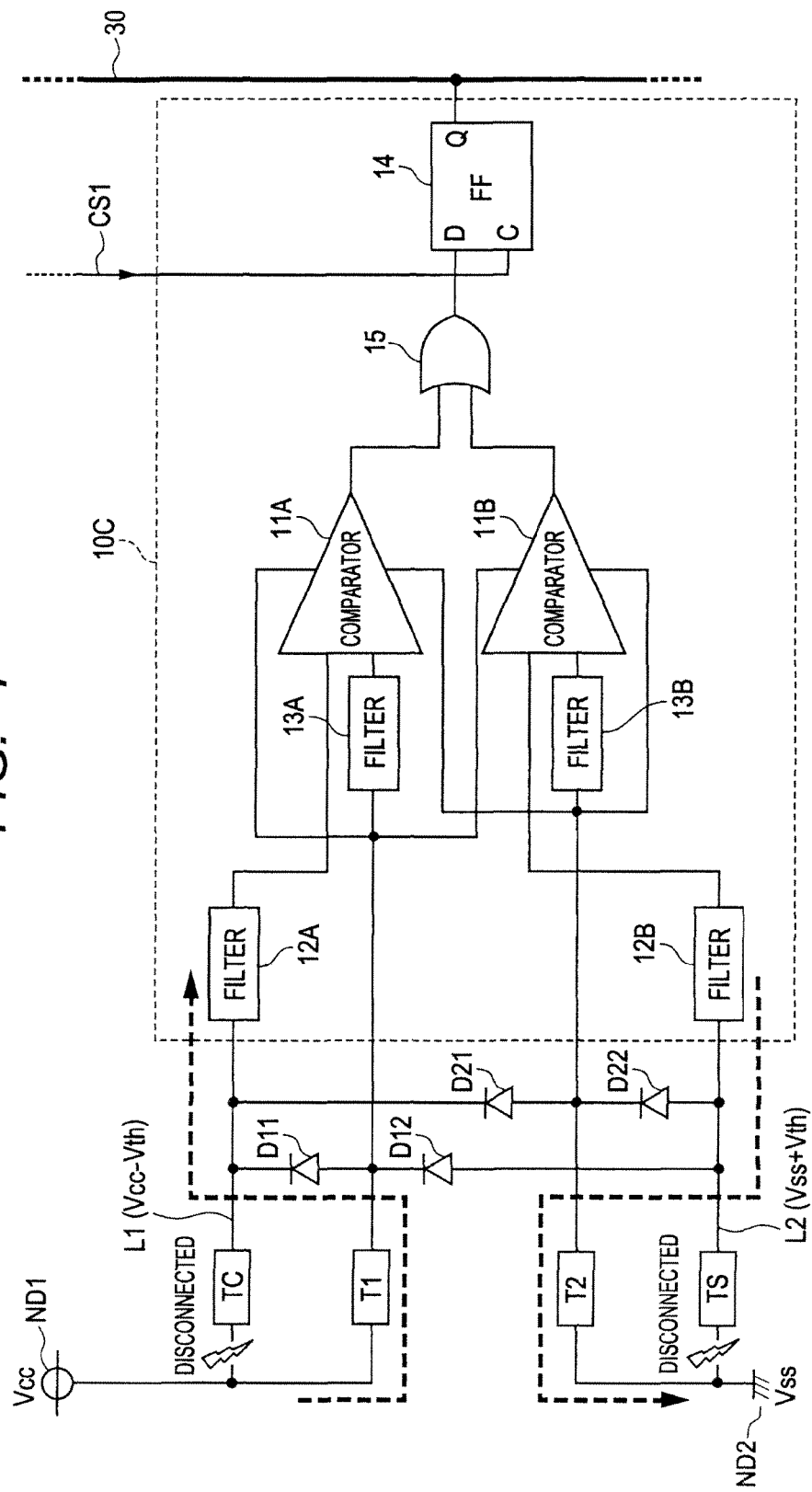
FIG. 4 is a circuit diagram illustrating a configuration of a voltage test unit into which the voltage test units in FIGS. 2 and 3 are combined.

FIG. 4 is a circuit diagram illustrating a configuration of a voltage test unit 10C into which the voltage test units 10A and 10B in FIGS. 2 and 3 are combined. FIG. 4 also illustrates the supply terminal TC, the ground terminal TS, the I/O terminals T1, T2, the parasitic diodes 811, D12, 821, D22, and the bus 30 in FIG. 4 together.

Referring to FIG. 4, the voltage test unit 10B includes the comparators 11A, 11B, the filters 12A, 13A, 12B, 13B for removing noises, an OR circuit 15, and the D flip-flop 14.

The first input node of the comparator 11A is coupled to the supply terminal TC through the filter 12A, and the second input node of the comparator 11A is coupled to the I/O terminal T1 through the filter 13A. The output node of the comparator 11A is coupled to a first input node of the OR circuit 15. The comparator 11A is driven by a voltage applied between the I/O terminals T1 and T2. The comparator 11A outputs the signal of the H level ("1") when an input voltage (voltage of supply terminal TC) of the first input node is lower than the input voltage (voltage of I/O terminal T1) of the second input node (disconnection of supply terminal TC).

The first input node of the comparator 11B is coupled to the ground terminal TS through the filter 12B, and the second input node of the comparator 11B is coupled to the I/O terminal T2 through the filter 13B. The output node of the comparator 11B is coupled to a second input node of the OR circuit 15. The comparator 11B is driven by the voltage applied between the I/O terminals T1 and T2. The comparator 11B outputs the signal of the H level ("1") when the input voltage (voltage of ground terminal TS) of the first input node is higher than the input voltage (voltage of I/O terminal T2) of the second input node (disconnection of ground terminal TS).

The OR circuit 15 outputs a signal of the H level to the data terminal D of the D flip-flop 14 when one output of the comparators 11A and 11B is H level. The CPU 21 in FIG. 1 acquires a signal output from the D flip-flop 14 through the bus 30 after changing the level of the control signal CS1 to the H level. The CPU 21 detects that at least one of the supply terminal TC and the ground terminal TS is abnormally coupled, due to a change in the level of the output signal from the D flip-flop 14 to the H level.

(Modified Example of Voltage Test Unit)

A modified example described below is characterized in that the input voltages of the comparators 11A and 11B are divided by resistors so that the comparators 11A and 11B can be driven by a voltage between the supply terminal TC and the ground terminal TS. Hereinafter, the modified example will be described in detail.

Figure 5:
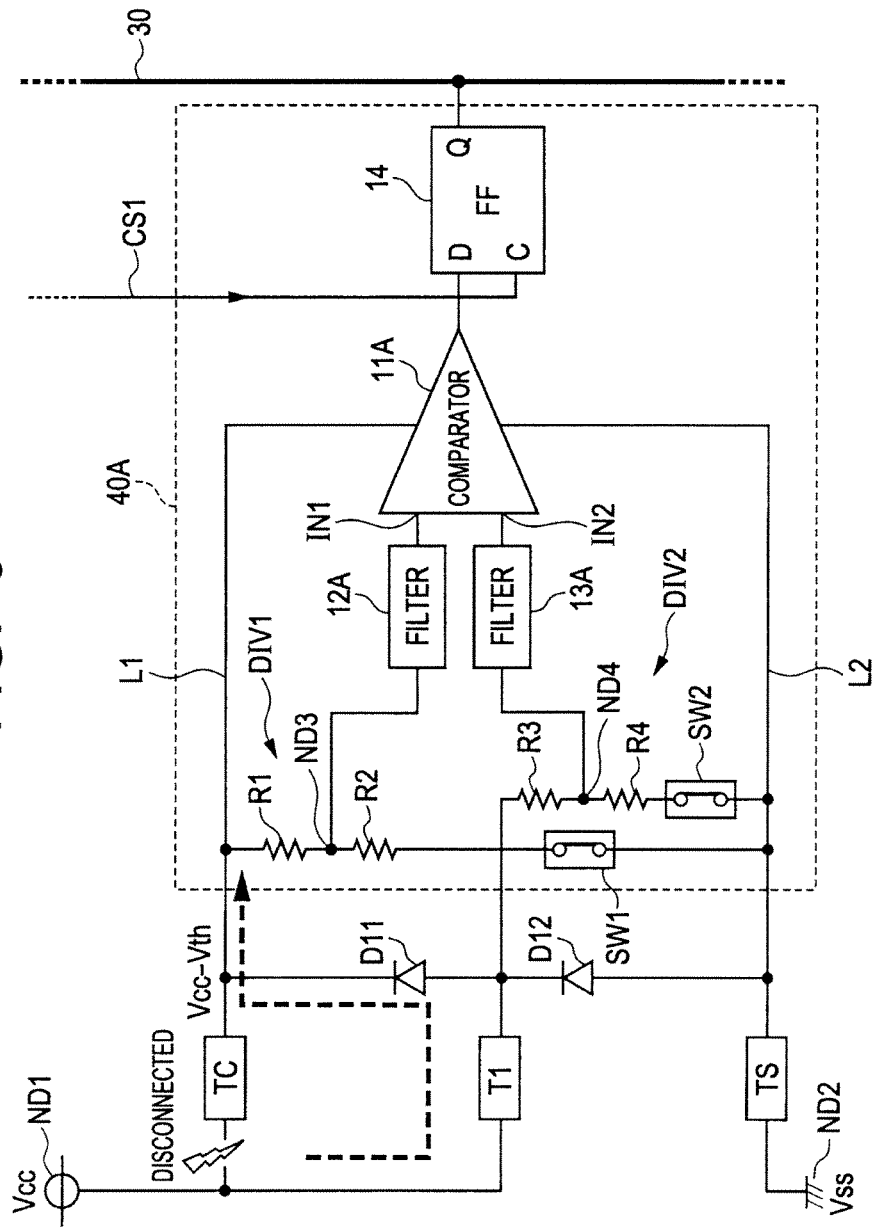
FIG. 5 is a circuit diagram illustrating a configuration of a voltage test unit as a modified example of the voltage test unit of FIG. 2.

FIG. 5 is a circuit diagram illustrating a configuration of a voltage test unit 40A as a modified example of the voltage test unit 10A of FIG. 2. FIG. 5 also illustrates the supply terminal TC, the ground terminal TS, the I/O terminal T1, the parasitic diodes D11, D12, and the bus 30 in FIG. 1 together.

The voltage test unit 40A in FIG. 5 is different from the voltage test unit 10A in FIG. 2 in that the voltage test unit 40A further includes resistive elements R1, R2, R3, R4 and switches SW1, SW2. The other constituent elements are identical with those in FIG. 2, and therefore identical or corresponding parts are denoted by the same reference numerals or symbols, and their description may not be repeated.

The resistive elements R1, R2 and the switch SW1 are arranged in series between the supply wiring L1 and the ground wiring L2 to configure a first voltage divider DIV1 that divides a voltage applied between the supply terminal TC and the ground terminal TS. The resistive elements R3, R4 and the switch SW2 are arranged in series between the I/O terminal T1 and the ground wiring L2 to configure a second voltage divider DIV2 that divides a voltage applied between the I/O terminal T1 and the ground terminal TS.

The switches SW1 and SW2 are controlled to be on only when it is tested whether the coupling state of the supply terminal TC is normal or not, and to be off during a normal operation. With this control, during the normal state, a current is prevented from flowing in a series coupling body of the resistive elements R1 and R2, and a series coupling body of the resistive elements R3 and R4 so as to eliminate useless power consumption.

The first input node IN1 of the comparator 11A is coupled to a coupling node ND3 of the resistive elements R1 and R2 through the filter 12A, and the second input node IN2 of the comparator 11A is coupled to a coupling node ND4 of the resistive elements R3 and R4 through the filter 13A. The output node of the comparator 11A is coupled to the data terminal D of the D flip-flop 14. The comparator 11A compares a voltage of the coupling node ND3 with a voltage of the coupling node ND4 to output a comparison result to the D flip-flop 14.

The comparator 11A is driven by a voltage applied between the supply terminal TC and the ground terminal TS. Even if a coupling of the supply terminal TC is in failure, there is a need to normally operate the comparator 11A by the supply voltage Vcc input to the I/O terminal T1. For that reason, the voltage input to the second input node IN2 is set to be lower than the drive voltage (Vcc−Vth) on the high voltage side. In other words, the resistance values r3 and r4 of the resistive elements R3 and R4 are set to satisfy a relationship of the following Expression (1).

$$Vcc \times r4/(r3+r4) < Vcc - Vth \qquad (1)$$

where in the above Expression (1), Vss=0 is set for simplification.

Further, when the supply voltage is applied to both of the supply terminal TC and the I/O terminal T1, the voltage of the coupling node ND3 is set to be higher than the voltage of the coupling node ND4. Also, when the supply terminal TC is opened, and the supply voltage Vcc is applied to the I/O terminal T1, the voltage of the coupling node ND3 is set to be lower than the voltage of the coupling node ND4. That is, the resistance values r1 to r4 of the resistive elements R1 to R4 are so set as to satisfy the following Expressions (2) and (3).

$$r2/(r1+r2) > r4/(r3+r4) \qquad (2)$$

$$(Vcc-Vth) \times r2/(r1+r2) < Vcc \times r4/(r3+r4) \qquad (3)$$

where in the above Expressions (2) and (3), Vss=0 is set for simplification.

Figure 6:
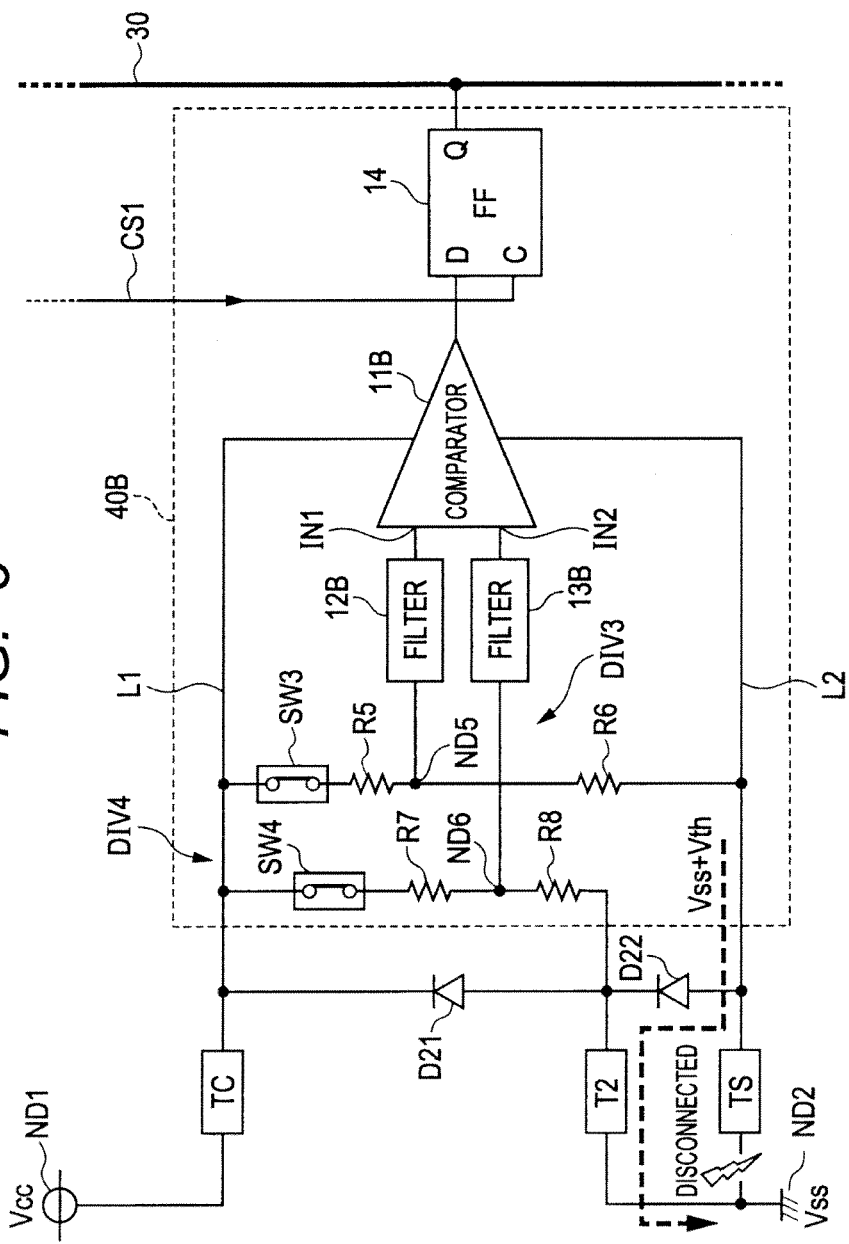
FIG. 6 is a circuit diagram illustrating a configuration of a voltage test unit as a modified example of the voltage test unit of FIG. 3.

FIG. 6 is a circuit diagram illustrating a configuration of a voltage test unit 40B as a modified example of the voltage test unit 10B of FIG. 3. FIG. 6 also illustrates the supply terminal TC, the ground terminal TS, the I/O terminal T2, the parasitic diodes D21, D22, and the bus 30 in FIG. 1 together.

The voltage test unit 40B in FIG. 6 is different from the voltage test unit 10B in FIG. 3 in that the voltage test unit 40B further includes resistive elements R5, R6, R7, R8 and switches SW3, SW4. The other constituent elements are identical with those in FIG. 3, and therefore identical or corresponding parts are denoted by the same reference numerals or symbols, and their description may not be repeated.

The resistive elements R5, R6 and the switch SW3 are arranged in series between the supply wiring L1 and the ground wiring L2 to configure a third voltage divider DIV3 that divides a voltage applied between the supply terminal TC and the ground terminal TS. The resistive elements R7, R8 and the switch SW4 are arranged in series between the I/O terminal T2 and the supply wiring L1 to configure a fourth voltage divider DIV4 that divides a voltage applied between the I/O terminal T2 and the supply terminal TC.

The switches SW3 and SW4 are controlled to be on only when it is tested whether the coupling state of the supply terminal TC is normal or not, and to be off during a normal operation. With this control, during the normal state, a current is prevented from flowing in a series coupling body of the resistive elements R5 and R6, and a series coupling body of the resistive elements R7 and R8 so as to eliminate useless power consumption.

The first input node IN1 of the comparator 11B is coupled to a coupling node ND5 of the resistive elements R5 and R6 through the filter 12B, and the second input node IN2 of the comparator 11B is coupled to a coupling node ND6 of the resistive elements R7 and R8 through the filter 13B. The output node of the comparator 11B is coupled to the data terminal D the D flip-flop 14. The comparator 11B compares a voltage of the coupling node ND5 with a voltage of the coupling node ND6 to output a comparison result to the D flip-flop 14.

The comparator 11B is driven by a voltage applied between the supply terminal TC and the ground terminal TS. When a coupling of the ground terminal TS is in failure, there is a need to normally operate the comparator 11B by the ground voltage Vss input to the I/O terminal T2. That is, the voltage input to the second input node IN2 is set to be higher than the drive voltage (Vss+Vth) on the low voltage side, that is, the resistance values r7 and r8 of the resistive elements R7 and R8 are set to satisfy a relationship of the following Expression (4).

$$Vcc \times r8/(r7+r8) > Vth \qquad (4)$$

where Vss=0 is set for simplification.

Further, when the ground voltage Vss is applied to both of the supply terminal TC and the I/O terminal T2, the voltage of the coupling node ND5 is set to be lower than the voltage of the coupling node ND6. Also, when the ground terminal TS is opened, and the ground voltage Vss is applied to the I/O terminal T2, the voltage of the coupling node ND5 is set to be higher than the voltage of the coupling node ND6. That is, the resistance values r5 to r8 of the resistive elements R5 to R8 are so set as to satisfy the following Expressions (5) and (6).

$$r6/(r5+r6) < r8/(r7+r8) \qquad (5)$$

$$(Vcc-Vth) \times r6/(r5+r6) > Vcc \times r8/(r7+r8) \qquad (6)$$

where in the above Expressions (5) and (6), Vss=0 is set for simplification.

Figure 7:
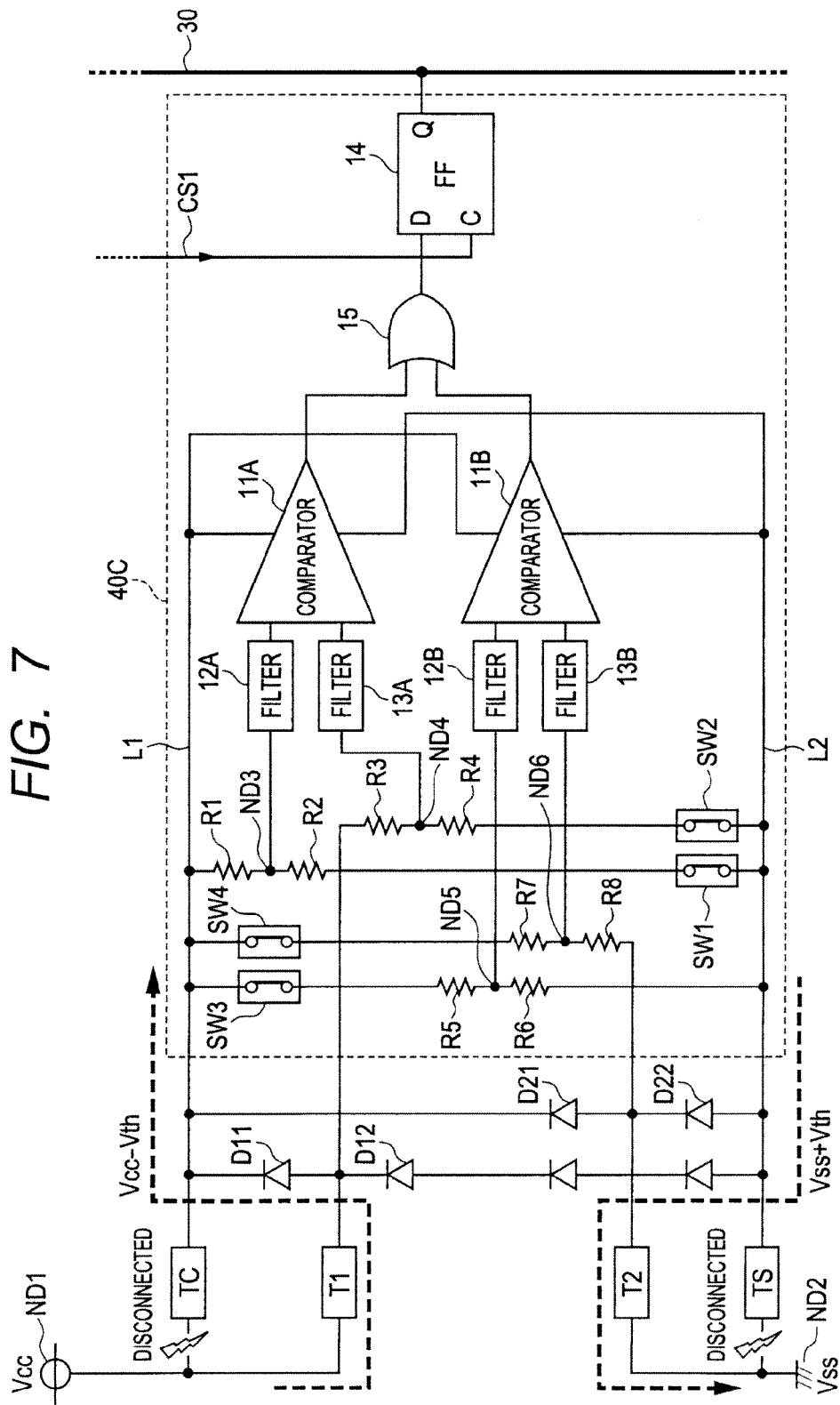
FIG. 7 is a circuit diagram illustrating a configuration of a voltage test unit into which the voltage test unit of FIG. 5 and the voltage test unit of FIG. 6 are combined.

FIG. 7 is a circuit diagram illustrating a configuration of a voltage test unit 40C into which the voltage test unit 40A of FIG. 5 and the voltage test unit 40B of FIG. 6 are combined. FIG. 7 also illustrates the supply terminal TC, the ground terminal TS, the I/O terminals T1, T2, the parasitic diodes D11, D12, D21, D22, and the bus 30 in FIG. 1 together.

The voltage test unit 40C in FIG. 7 includes resistive elements R1 to R8, switches SW1 to SW4, the filters 12A, 13A, 12B, 13B, filter 12A, the comparators 11A, 11B, the OR circuit 15, and the D flip-flop 14.

Among those constituent elements, the couplings and operations of the resistive elements R1 to R4, the switches SW1, SW2, the filters 12A, 13A, and the comparator 11A are identical with those in the case of FIG. 5 except that the output node of the comparator 11A is coupled to the first input node of the OR circuit 15. The couplings and operations of the resistive elements R5 to R8, the switches SW3, SW4, the filters 12B, 13B, and the comparator 11B are identical with those in the case of FIG. 6 except that the output node of the comparator 11B is coupled to the second input node of the OR circuit 15.

The OR circuit 15 outputs a signal of the H level to the data terminal D of the D flip-flop 14 when one output of the comparators 11A and 11B is H level. The CPU 21 in FIG. 1 acquires a signal output from the D flip-flop 14 through the bus 30 after changing the level of the control signal CS1 to the H level. The CPU 21 detects that at least one of the supply terminal TC and the ground terminal TS is abnormally coupled, due to a change in the level of the output signal from the D flip-flop 14 to the H level.

Figure 8:
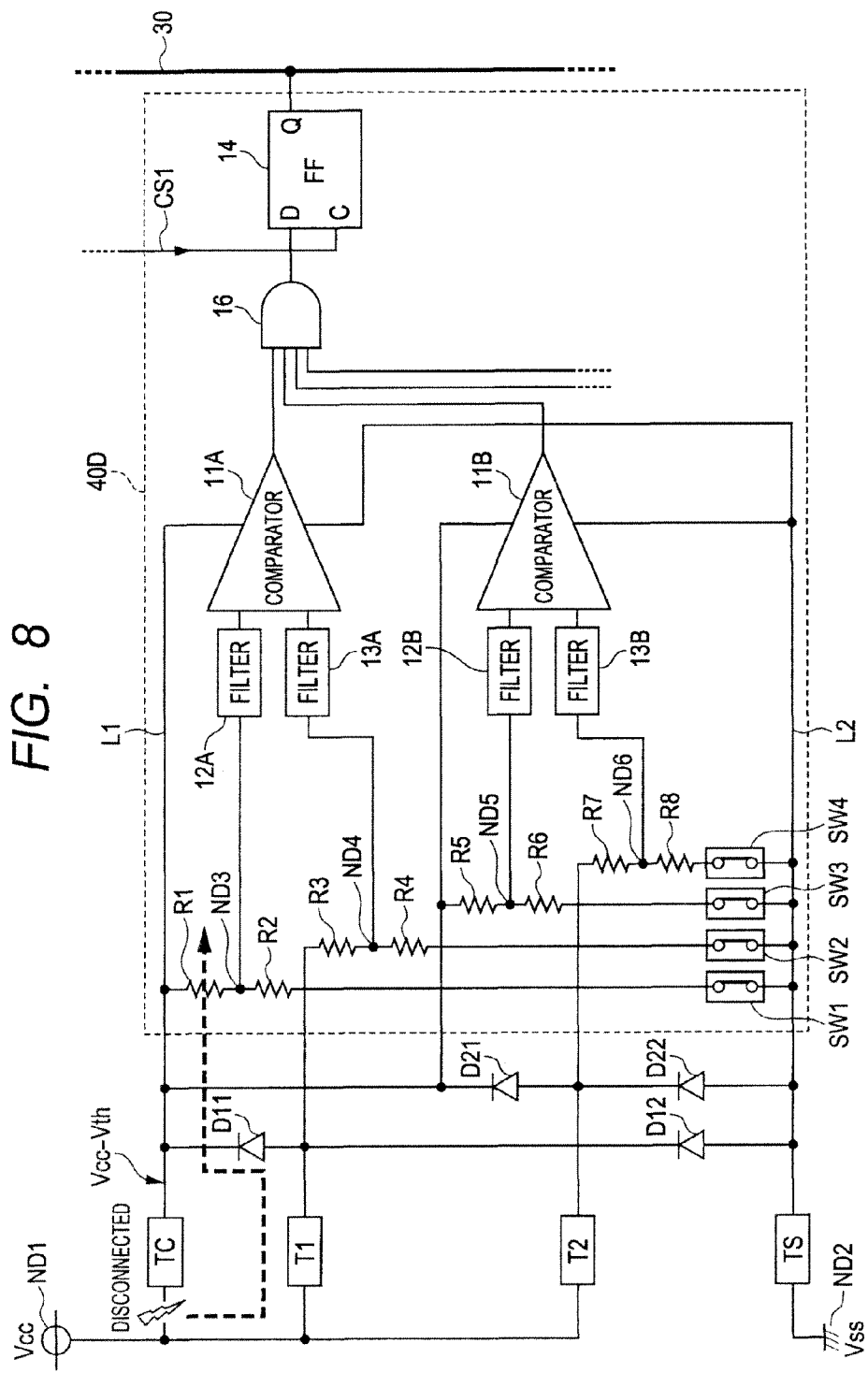
FIG. 8 is a circuit diagram illustrating a configuration of a voltage test unit as a modified example of the voltage test unit of FIG. 5.

FIG. 8 is a circuit diagram illustrating a configuration of a voltage test unit 40D as a modified example of the voltage test unit 40A. FIG. 8 also illustrates the supply terminal TC, the ground terminal TS, the I/O terminals T1, T2, the parasitic diodes D11, D12, D21, D22, and the bus 30 in FIG. 1 together. However, the I/O terminal T2 is coupled to not the ground node ND2 but the power node ND1.

The voltage test unit 40D of FIG. 8 is different from the voltage test unit 40A of FIG. 5 in that the voltage test unit 40D further includes the resistive elements R5, R6, R7, R8, the switches SW3, SW4, and an OR circuit 16. The other constituent elements are identical with those in FIG. 5, and therefore identical or corresponding parts are denoted by the same reference numerals or symbols, and their description may not be repeated.

The resistive elements R5, R6 and the switch SW3 are arranged in series between the supply wiring L1 and the ground wiring L2 to configure a voltage divider that divides a voltage applied between the supply terminal TC and the ground terminal TS. The resistive elements R7, R8 and the switch SW4 are arranged in series between the I/O terminal T2 and the ground wiring L2 to configure a voltage divider that divides a voltage applied between the I/O terminal T2 and the ground terminal TS.

The switches SW3 and SW4 are controlled to be on only when it is tested whether the coupling state of the supply terminal TC is normal or not, and to be off during a normal operation. With this control, during the normal state, a current is prevented from flowing in a series coupling body of the resistive elements R5 and R6, and a series coupling body of the resistive elements R7 and R8 so as to eliminate useless power consumption.

The first input node of the comparator 11B is coupled to the coupling node ND5 of the resistive elements R5 and R6 through the filter 12B, and the second input node of the comparator 11B is coupled to the coupling node ND6 of the resistive elements R7 and R8 through the filter 13B. The output node of the comparator 11B is coupled to one of the input nodes of the OR circuit 16. The comparator 11B compares a voltage of the coupling node ND5 with a voltage of the coupling node ND6 to output a comparison result to the OR circuit 16.

The resistive elements R5 to R8, the filters 12B, 13B, the comparator 11B, and the I/O terminal T2 correspond to the resistive elements R1 to R4, the filters 12A, 13A, the comparator 11A, and the I/O terminal T1 in FIG. 5, respectively.

The OR circuit 16 outputs a signal of the H level to the data terminal D of the D flip-flop 14 when both outputs of the comparators 11A and 11B are H level. The CPU 21 determines that the coupling of the supply terminal TC is abnormal, due to a change in the level of the output signal of the D flip-flop 14 to the H level. As compared with the case of FIG. 5, since the respective voltages of the I/O terminals T1 and T2 are compared with the voltage of the supply terminal TC, the coupling failure of the supply terminal TC can be more surely detected.

Second Embodiment

Figure 9:
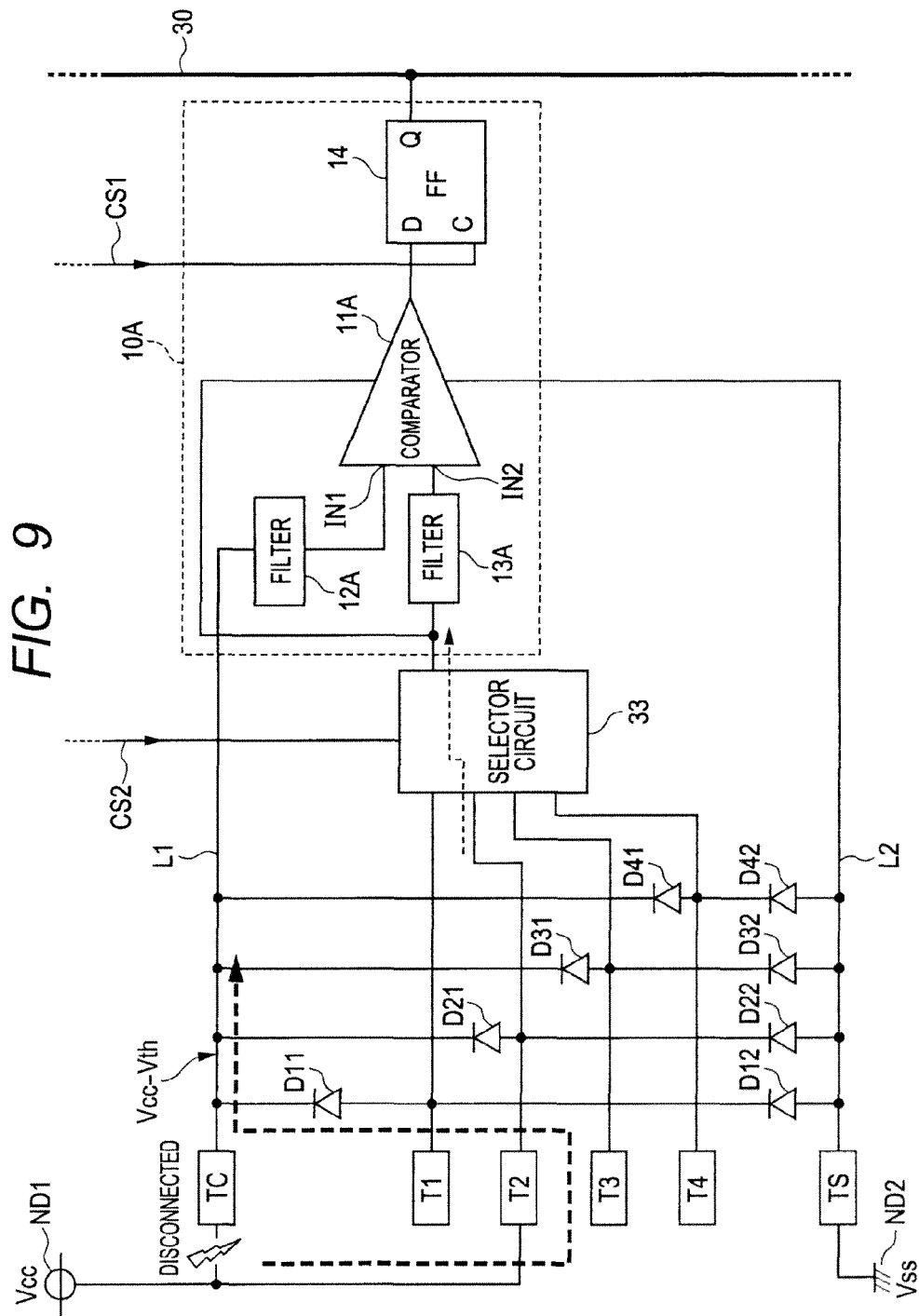
FIG. 9 is a block diagram illustrating a configuration of a semiconductor device according to a second embodiment of the present invention.

FIG. 9 is a block diagram illustrating a configuration of a semiconductor device according to a second embodiment of the present invention.

In the semiconductor device of FIG. 9, a selector circuit 33 is further added to the semiconductor device of FIG. 2. The selector circuit 33 is coupled to the I/O terminals T1 to T4. The selector circuit 33 selects one of the I/O terminals T1 to T4 according to a control signal CS2, and outputs a voltage of the selected I/O terminal to the voltage test unit 10A.

As described in the first embodiment, the parasitic diodes D11, D21, D31, and D41 are disposed between the I/O terminals T1 to T4 and the supply terminal TC, respectively, so that the supply terminal TC is arranged on the cathode side thereof. The parasitic diodes D12, D22, D32, and D42 are disposed between the I/O terminals T1 to T4 and the ground terminal TS, respectively, so that the ground terminal TS is arranged on the anode side thereof.

The voltage test unit 10A includes the comparator 11A, the filters 12A, 13A for removing noise, and the D flip-flop 14. The first input node IN1 of the comparator 11A is coupled to the supply terminal TC through the filter 12A, and the second input node IN2 of the comparator 11A is coupled to an output node of the selector circuit 33 through the filter 13A. The output node of the comparator 11A is coupled to the data terminal D of the D flip-flop 14.

The comparator 11A is driven by a voltage applied between the output node of the selector circuit 33 and the ground terminal TS (ground wiring L2), and compares the input voltage (voltage of upply terminal TC) of the first input node IN1 with an input voltage (voltage of I/O terminal selected by selector circuit 33) of the second input node IN2. The comparator 11A outputs a signal of the H level ("1") when the input voltage (voltage of supply terminal TC) of the first input node IN1 is lower than the input voltage (voltage of the I/O terminal selected by selector circuit 33) of the second input node IN2.

Specifically, FIG. 9 illustrates a case in which the supply voltage Vcc is applied to the I/O terminal T2. In this case, the I/O terminal T2 is selected by the selector circuit 33, and the voltage of the selected I/O terminal T2 and the voltage of the supply terminal TC are compared by the comparator 11A so as to determine whether the coupling state of the supply terminal TC is normal or not. Thus, with the provision of the selector circuit 33, the voltage of a desired terminal of the I/O terminals T1 to T4 can be compared with the voltage of the supply terminal TC by one comparator without provision of the respective comparators for the I/O terminals T1 to T4.

The other constituent elements are identical with those in FIG. 2, and therefore identical or corresponding parts are denoted by the same reference numerals or symbols, and their description may not be repeated.

Figure 10:
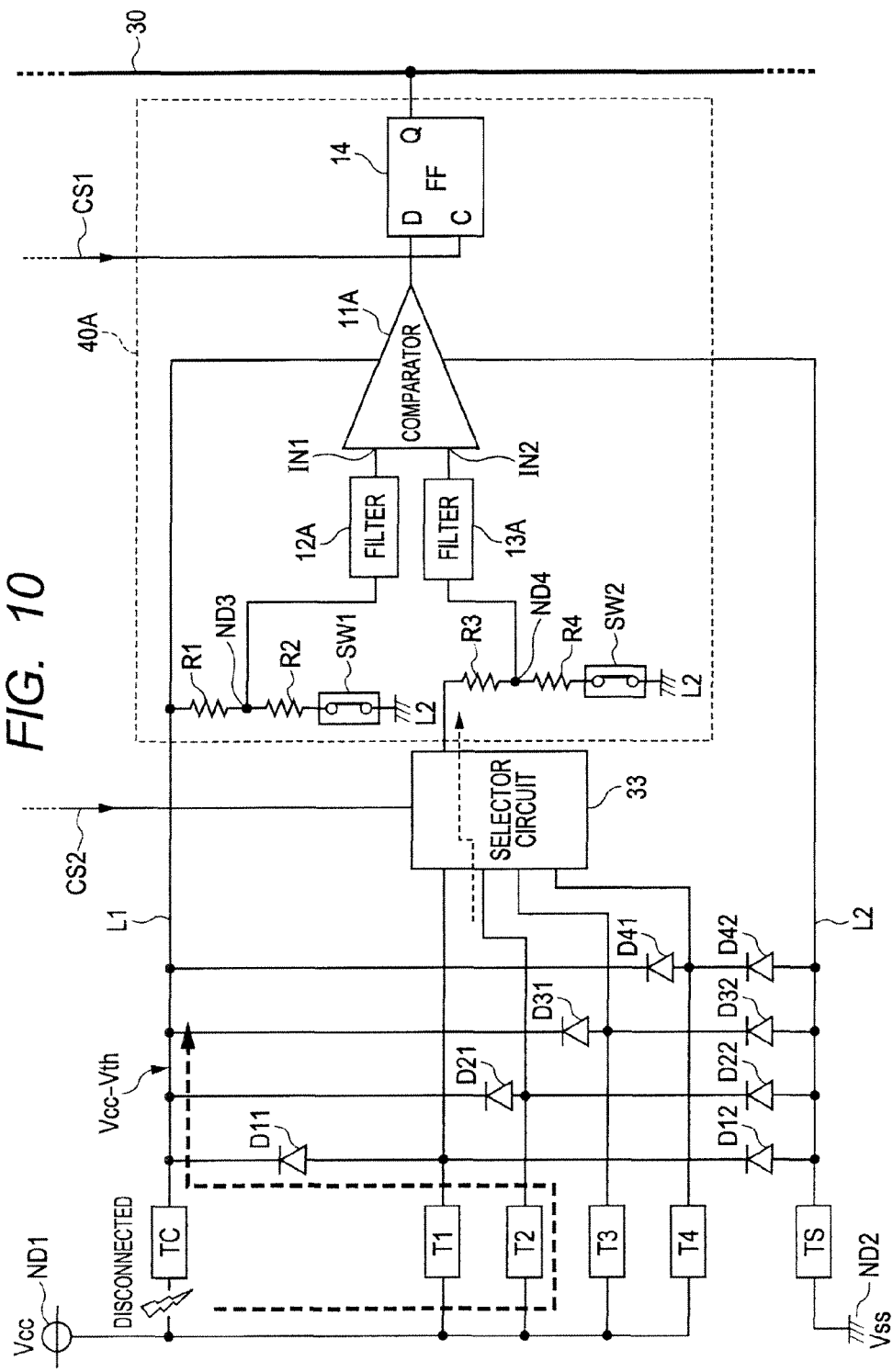
FIG. 10 is a block diagram illustrating a modified example of the semiconductor device in FIG. 9.

FIG. 10 is a block diagram illustrating a modified example of the semiconductor device in FIG. 9. The semiconductor device of FIG. 10 is different from the semiconductor device of FIG. 9 in that the voltage test unit 10A is replaced with the voltage test unit 40A described in FIG. 5.

The voltage test unit 40A includes the comparator 11A, the filters 12A, 13A, the D flip-flop 14, the resistive elements R1 to R4, and the switches SW1, SW2.

The resistive elements R1, R2 and the switch SW1 are arranged in series between the supply wiring L1 and the ground wiring L2 to configure a first voltage divider that divides a voltage applied between the supply terminal TC and the ground terminal TS. The resistive elements R3, R4 and the switch SW2 are arranged in series between the output node of the selector circuit 33 and the ground wiring L2 to configure a second voltage divider that divides a voltage applied between the I/O terminal selected by the selector circuit 33 and the ground terminal TS. The switches SW1 and SW2 are on only when it is tested whether the coupling state of the supply terminal TC is normal or not.

The comparator 11A is driven by a voltage applied between the supply terminal TC and the ground terminal TS. The first input node IN1 of the comparator 11A is coupled to the coupling node ND3 of the resistive elements R1 and R2 through the filter 12A, and the second input node IN2 of the comparator 11A is coupled to the coupling node ND4 of the resistive elements R3 and R4 through the filter 13A. The output node of the comparator 11A is coupled to the data terminal D of the D flip-flop 14. The comparator 11A compares the voltage of the coupling node ND3 with the voltage of the coupling node ND4, and outputs a comparison result to the D flip-flop 14.

The I/O terminals T1 to T4 are selected in sequence by the selector circuit 33 so that the voltage of the selected I/O terminal can be compared with the voltage of the ground terminal TS by the voltage test unit 40A. Therefore, there is no need to provide the comparator 11A for each of the I/O terminals T1 to T4. The other configurations in FIG. 10 are identical with those described in FIGS. 5 and 9, and therefore identical or corresponding parts are denoted by the same reference numerals or symbols, and their description will not be repeated.

Figure 11:
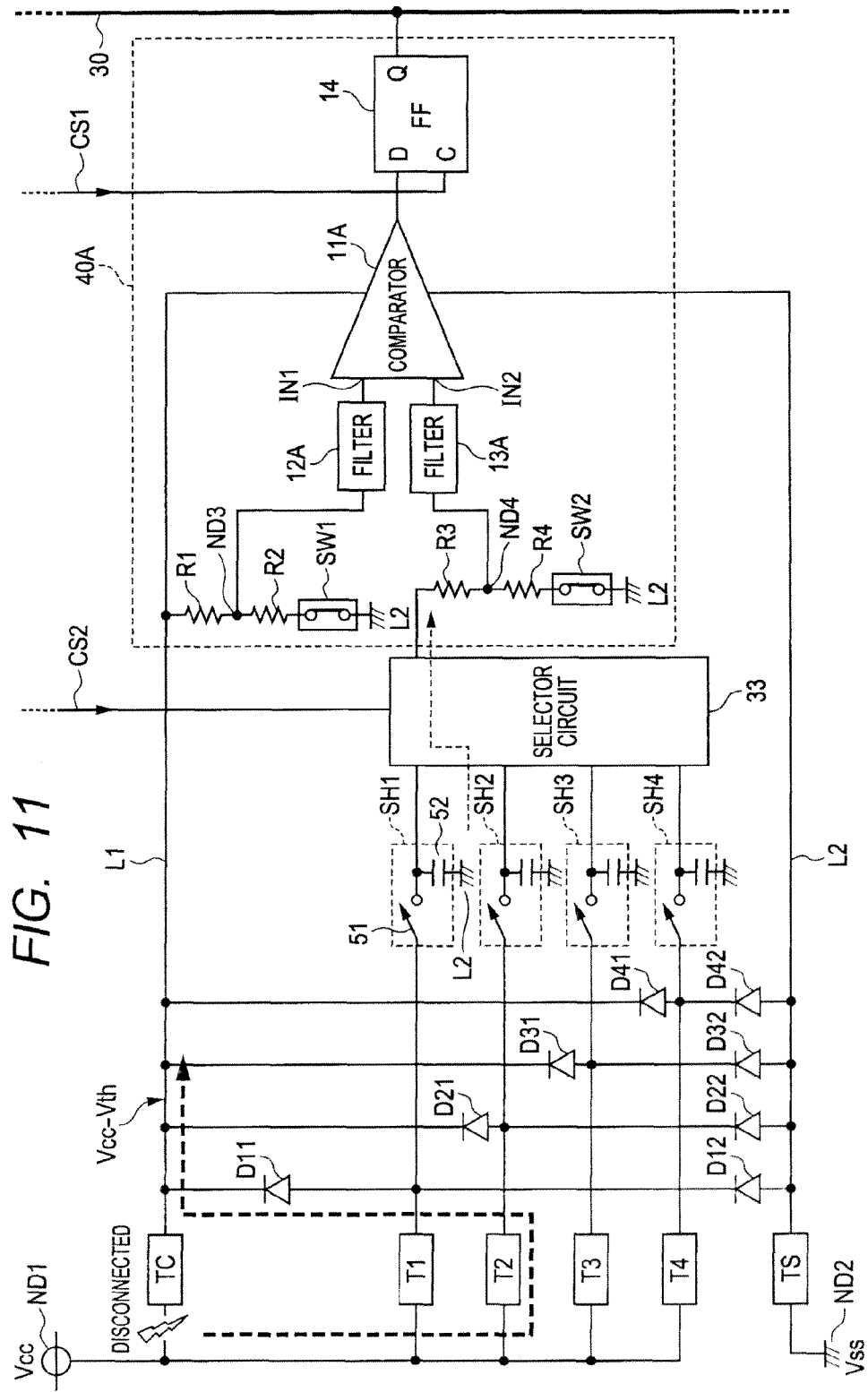
FIG. 11 is a block diagram illustrating a modified example of the semiconductor device in FIG. 10.

FIG. 11 is a block diagram illustrating a modified example of the semiconductor device in FIG. 10. The semiconductor device of FIG. 11 is different from the semiconductor device of FIG. 10 in that the device of FIG. 11 further includes sample-hold circuits SH1 to SH4. The sample-hold circuits SH1 to SH4 are disposed in correspondence with the I/O terminals T1 to T4, respectively.

The sample-hold circuit SH1 includes a switch 51 that is disposed between the corresponding I/O terminal T1 and the input node of the selector circuit 33, and a capacitor 52 that is disposed between the input node of the selector circuit 33 and the ground wiring L2. The sample-hold circuit SH1 captures the voltage of the I/O terminal T1, and holds the captured voltage in the capacitor 52. As with the sample-hold circuit SH1, each of the sample-hold circuits SH2 to SH4 is disposed between the corresponding I/O terminal and the input node of the selector circuit 33, and holds the voltage of the corresponding I/O terminal.

With the provision of the sample-hold circuits SH1 to SH4, the voltages of the I/O terminals T1 to T4 can be captured at the same timing, and compared with the voltage of the supply terminal TC. The other configurations in FIG. 11 are identical with those described in FIG. 10, and therefore identical or corresponding parts are denoted by the same reference numerals or symbols, and their description will not be repeated.

Third Embodiment

Figure 12:
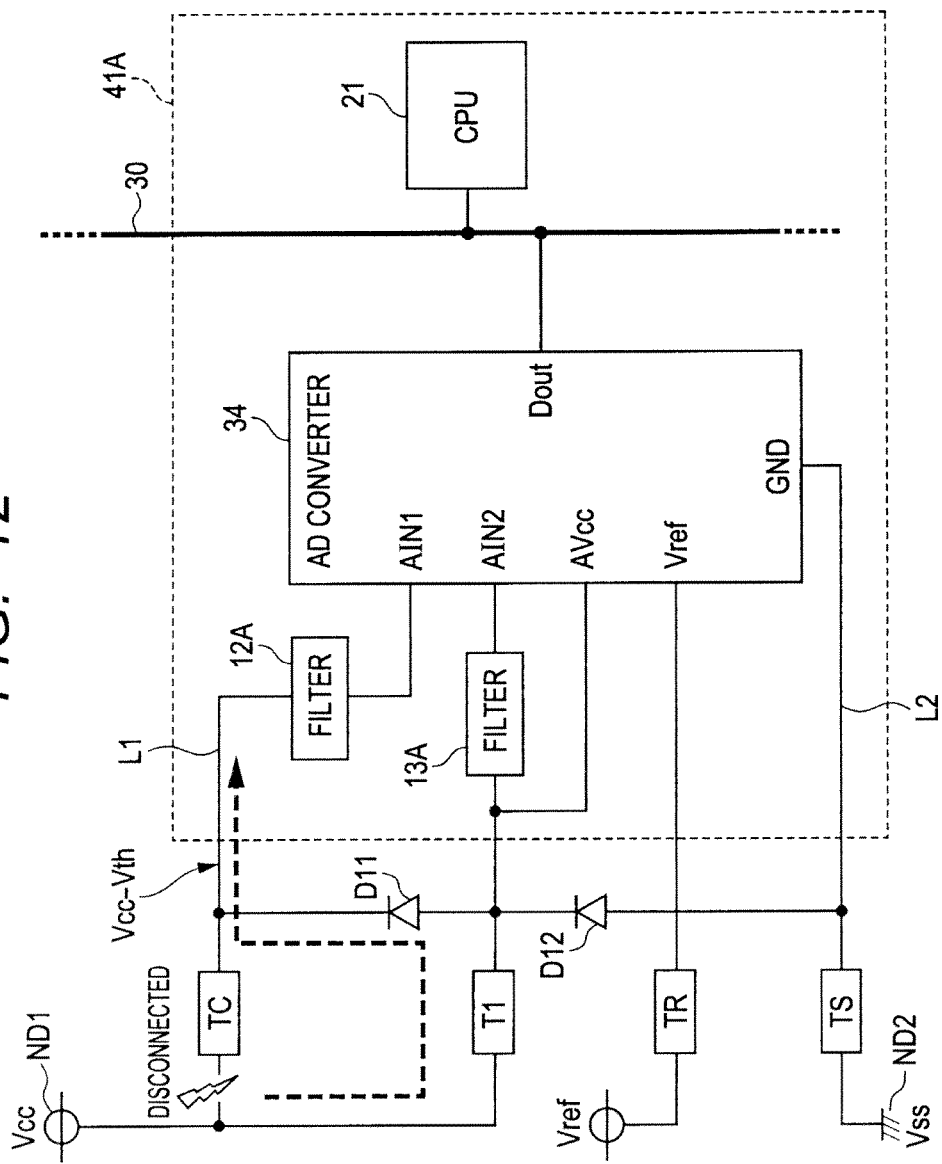
FIG. 12 is a block diagram illustrating a configuration of a semiconductor device according to a third embodiment of the present invention.

FIG. 12 is a block diagram illustrating a configuration of a semiconductor device according to a third embodiment of the present invention. FIG. 12 illustrates a configuration of a voltage test unit 41A as a modified example of the voltage test unit 10A in FIG. 2.

The voltage test unit 41A includes an AD (analog-to-digital) converter 34, the filters 12A, 13A, and the CPU 21. The AD converter 34 is equipped with analog input terminals AIN1, AIN2, a supply terminal AVcc that receives the supply voltage Vcc, a ground terminal GND that receives the ground voltage Vss, a reference voltage terminal that receives a reference voltage Vref, and a digital output terminal Dout. The AD converter 34 converts analog voltages input to the analog input terminals AIN1 and AIN2 to digital voltages in sequence, and outputs the digital voltages from the digital output terminal Dout to the bus 30.

The first analog input terminal AIN1 of the AD converter 34 is coupled to the supply terminal TC through the filter 12A. The second analog input terminal AIN2 of the AD converter 34 is coupled to the I/O terminal T1 through the filter 13A. The supply terminal AVcc of the AD converter 34 is coupled to the I/O terminal T1, and the ground terminal GND of the AD converter 34 is coupled to the ground terminal TS. The AD converter 34 operates due to a voltage applied between the I/O terminal T1 and the ground terminal GND when the supply voltage Vcc is input to the I/O terminal T1.

The CPU 21 coupled to the AD converter 34 through the bus 30 acquires the digitally converted voltage of the supply terminal TC and the digitally converted voltage of the I/O terminal T1, which have been output from the AD converter 34. The CPU 21 compares a digital value indicative of the acquired voltage of the supply terminal TC with a digital value indicative of the acquired voltage of the I/O terminal T1 to determine whether the coupling state of the supply terminal TC is normal or not.

Figure 13:
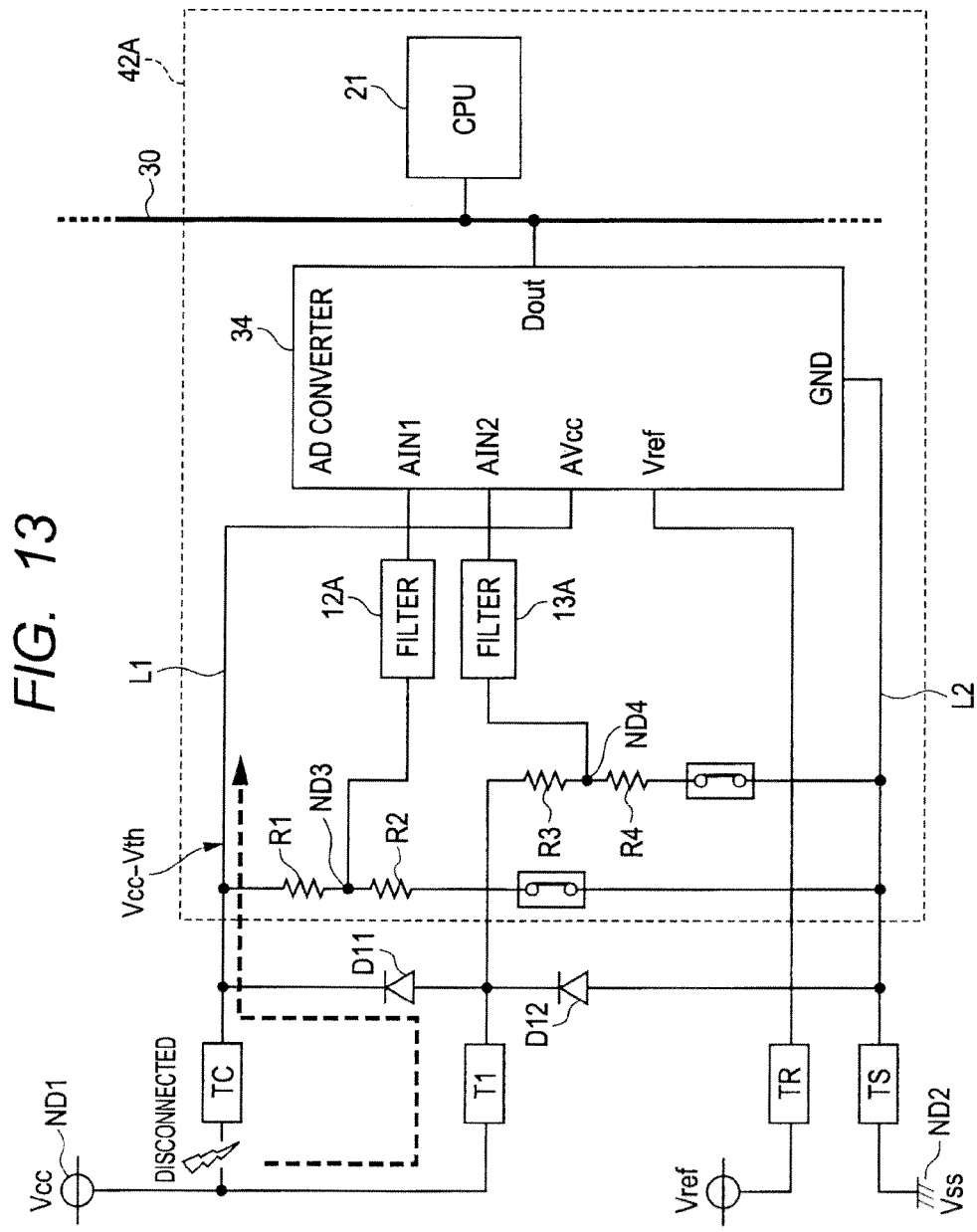
FIG. 13 is a circuit diagram illustrating a configuration of a voltage test unit as a modified example of the voltage test unit of FIG. 12.

FIG. 13 is a circuit diagram illustrating a configuration of a voltage test unit 42A as a modified example of the voltage test unit 41A of FIG. 12. The voltage test unit 42A of FIG. 13 is different from the voltage test unit 41A of FIG. 12 in that the voltage test unit 42A further includes the resistive elements R1, R2, R3, R4, and the switches SW1, SW2. The other configurations are identical with those described in FIG. 12, and therefore identical or corresponding parts are denoted by the same reference numerals or symbols, and their description will not be repeated.

The resistive elements R1, R2 and the switch SW1 are arranged in series between the supply wiring L1 and the ground wiring L2 to configure a first voltage divider that divides a voltage applied between the supply terminal TC and the ground terminal TS. The resistive elements R3, R4 and the switch SW2 are arranged in series between the I/O terminal T1 and the ground wiring L2 to configure a second voltage divider that divides a voltage applied between the I/O terminal T1 and the ground terminal TS. The switches SW1 and SW2 are on only when it is tested whether the coupling state of the supply terminal TC is normal or not.

The first analog input terminal AIN1 of the AD converter 34 is coupled to the coupling node ND3 of the resistive elements R1 and R2 through the filter 12A. The second analog input terminal AIN2 of the AD converter 34 is coupled to the coupling node ND4 of the resistive elements R3 and R4 through the filter 13A. The supply terminal AVcc of the AD converter 34 is coupled to the supply terminal TC, and the ground terminal GND of the AD converter 34 is coupled to the ground terminal TS. The AD converter 34 operates due to a voltage applied between the supply terminal TC and the ground terminal GND.

Even if the coupling of the supply terminal TC is in failure, there is a need to normally operate the AD converter 34 by the supply voltage Vcc input to the I/O terminal T1. For that reason, the voltage input to the second analog input terminal AIN2 of the AD converter 34 is set to be lower than the voltage (Vcc−Vth) input to the supply terminal AVcc. In other words, the resistance values r3 and r4 of the resistive elements R3 and R4 are set to satisfy a relationship of the following Expression (7).

$$Vcc \times r4/(r3+r4) < Vcc - Vth \quad (7)$$

where in the above Expression (7), Vss=0 is set for simplification.

The CPU 21 coupled to the AD converter 34 through the bus 30 acquires the digitally converted voltage of the coupling node ND3 and the digitally converted voltage of the coupling node ND4, which have been output from the AD converter 34. The CPU 21 calculates a voltage value of the supply terminal TC and a voltage value of the I/O terminal T1 on the basis of a digital value indicative of the acquired voltage of the coupling node ND3 and a digital value indicative of the acquired voltage of the coupling node ND4. The CPU 21 compares the calculated voltage value of the supply terminal TC with the calculated voltage value of the I/O terminal T1 to determine whether the coupling state of the supply terminal TC is normal or not.

Fourth Embodiment

A fourth embodiment pertains to a fail-safe technique by which the semiconductor device is brought into a safe state when the supply terminal TC is disconnected by deteriorating the solder joint during the operation of the semiconductor device. Hereinafter, this embodiment will be described in detail with reference to FIGS. 14 to 17.

Figure 14:
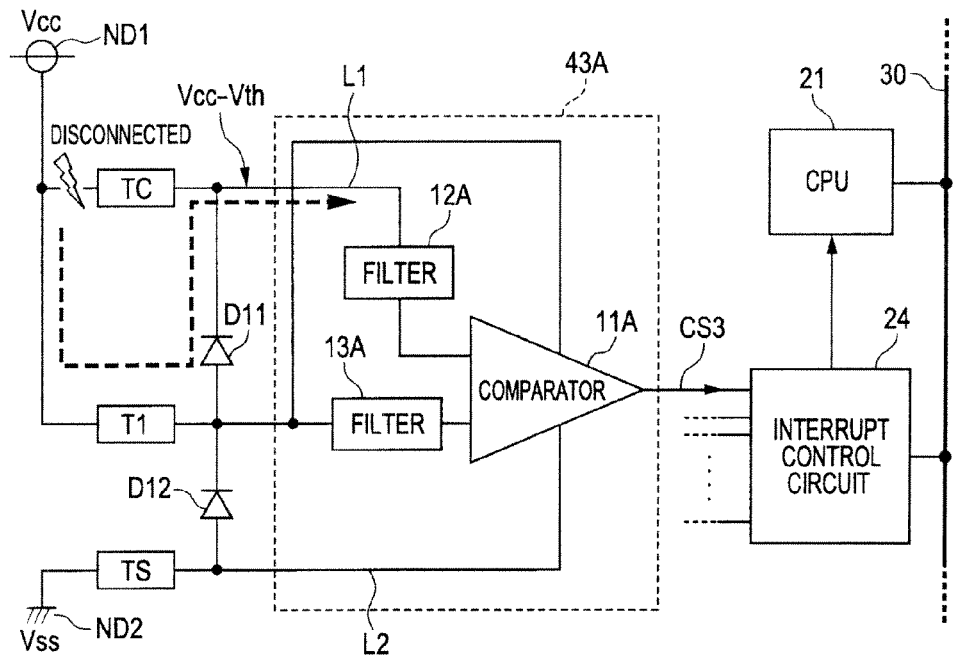
FIG. 14 is a block diagram illustrating a configuration of a semiconductor device according to a fourth embodiment of the present invention.

FIG. 14 is a block diagram illustrating a configuration of a semiconductor device according to the fourth embodiment of the present invention. The semiconductor device of FIG. 14 modifies the semiconductor device of FIG. 2. More specifically, a voltage test unit 43A is different from the voltage test unit 10A in FIG. 2 in that the voltage test unit 43A does not include the D flip-flop 14.

The comparator 11A compares the voltage of the supply terminal TC with the voltage of the I/O terminal T1, and outputs a signal CS3 (abnormal signal) of the H level to the interrupt control circuit 24 when the voltage of the supply terminal TC is lower than the voltage of the I/O terminal T1. Upon receiving the signal CS3 of the H level, the interrupt control circuit 24 issues an interrupt notice to the CPU 21. The CPU 21 that has received the interrupt notice safely stops the semiconductor device.

Figure 15:
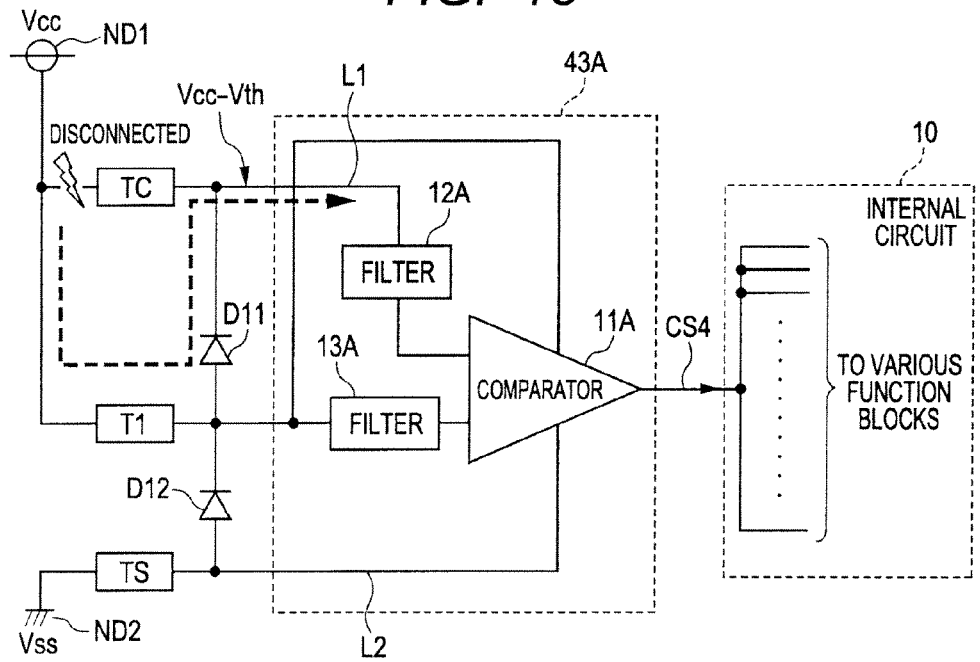
FIG. 15 is a block diagram illustrating a configuration of a semiconductor device according to one modified example of the fourth embodiment of the present invention.

FIG. 15 is a block diagram illustrating a configuration of a semiconductor device according to one modified example of the fourth embodiment of the present invention. The configuration of the voltage test unit 43A in FIG. 15 is identical with that in FIG. 14. In FIG. 15, the comparator 11A compares the voltage of the supply terminal TC with the voltage of the I/O terminal T1, and outputs a reset signal CS4 of the H level to the respective functional blocks configuring the internal circuit 20 when the voltage of the supply terminal TC is lower than the voltage of the I/O terminal T1. The respective functional blocks conduct initialization upon receiving a reset signal of the H level.

Figure 16:
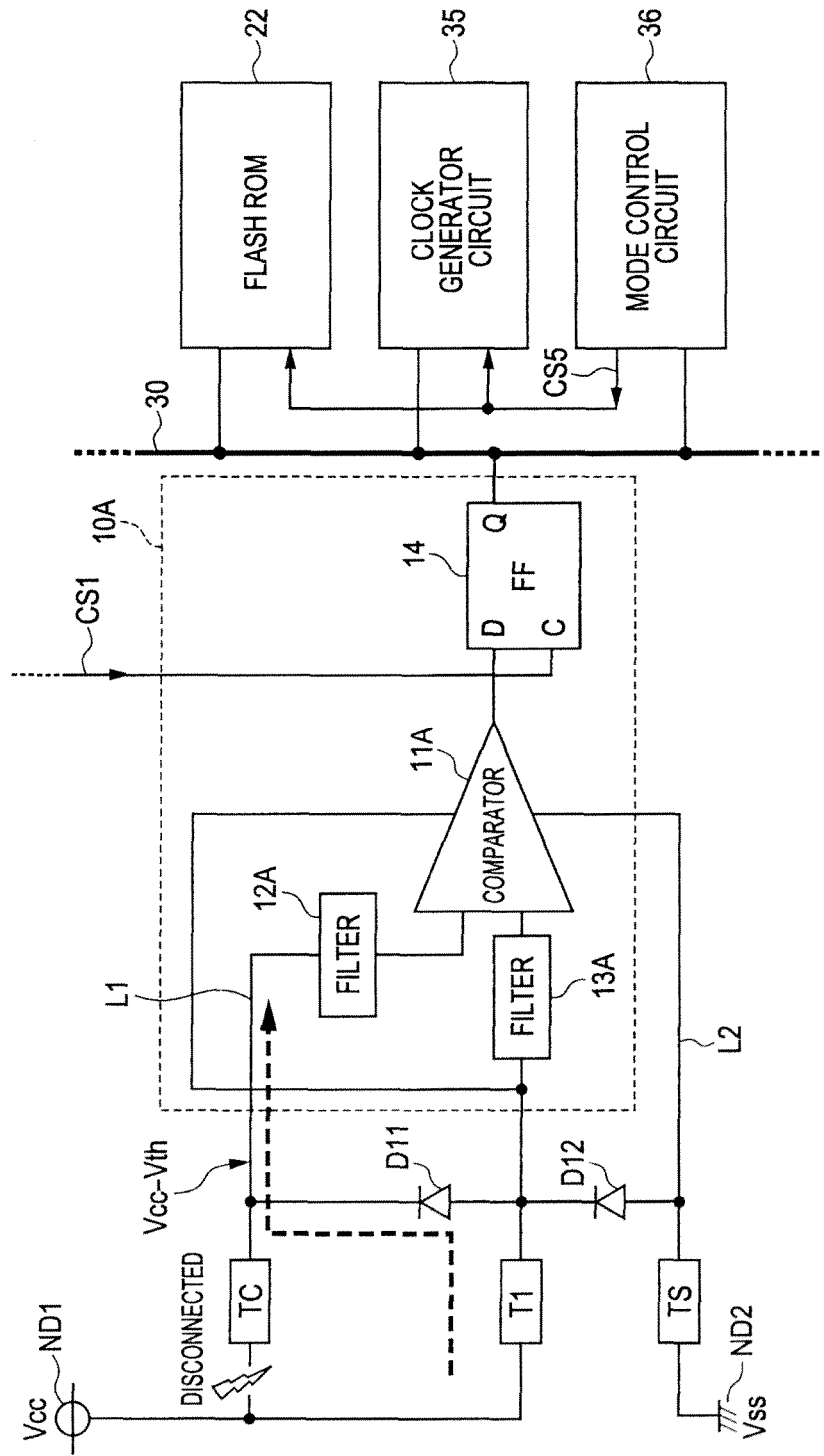
FIG. 16 is a block diagram illustrating a configuration of a semiconductor device according to another modified example of the fourth embodiment of the present invention.

FIG. 16 is a block diagram illustrating a configuration of a semiconductor device according to another modified example of the fourth embodiment of the present invention. The semiconductor device of FIG. 16 further includes a clock generator circuit 35 that generates an internal clock used in the internal circuit 20, and a mode control circuit 36. The other configurations in FIG. 16 are identical with those of the semiconductor devices described in FIGS. 1 and 2, and therefore identical or corresponding parts are denoted by the same reference numerals or symbols, and their description will not be repeated.

The mode control circuit 36 detects the output of the D flip-flop 14 as needed, and outputs a mode control signal CS5 for switching an operation mode of the semiconductor device from a normal mode to a power saving mode when the output of the D flip-flop 14 becomes H level. Upon receiving the mode control signal CS5, the flash memory ROM 22 conducts only read operation, and does not conduct write operation and erase operation requiring a high voltage. Upon receiving the mode control signal CS5, the clock generator circuit 35 makes a generated clock frequency lower than that in a normal state.

Figure 17:
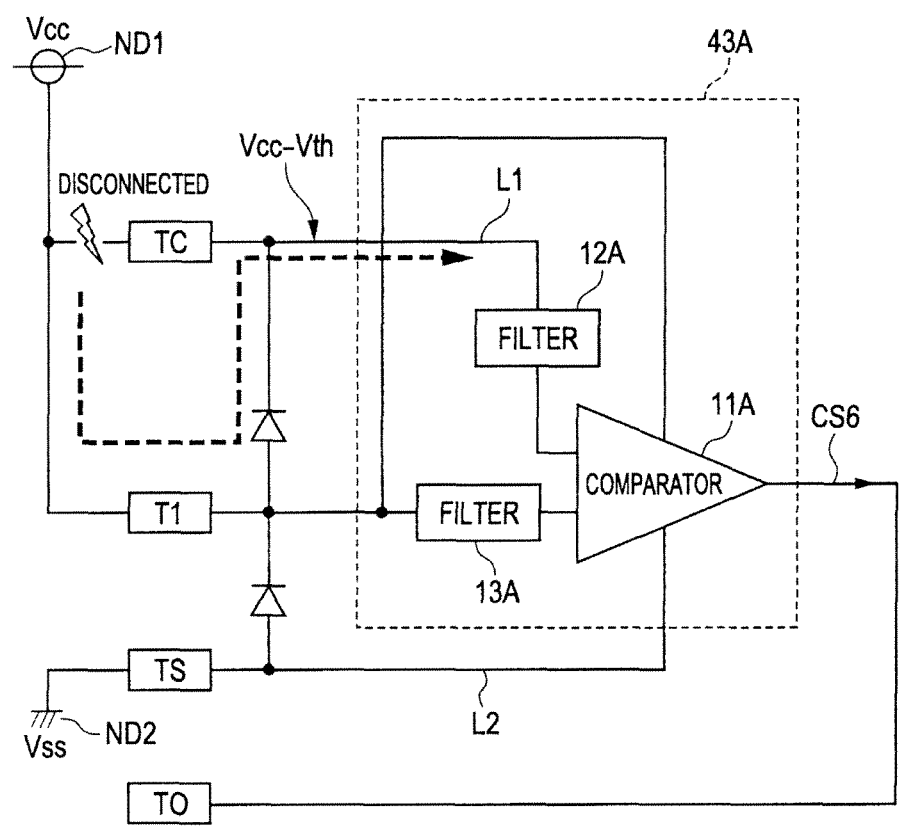
FIG. 17 is a block diagram illustrating a configuration of a semiconductor device according to still another modified example of the fourth embodiment of the present invention.

FIG. 17 is a block diagram illustrating a configuration of a semiconductor device according to still another modified example of the fourth embodiment of the present invention.

The configuration of the voltage test unit 43A in FIG. 17 is identical with that of FIG. 14. In FIG. 17, the comparator 11A compares the voltage of the supply terminal TC with the voltage of the I/O terminal T1, and outputs a signal CS6 (abnormal signal) of the H signal to the external of the semiconductor device through an output terminal TC when the voltage of the supply terminal TC is lower than the voltage of I/O terminal T1. For example, upon receiving the signal CS6 from the semiconductor device, a controller disposed outside of the semiconductor device safely stops the semiconductor device.

Fifth Embodiment

A fifth embodiment pertains to a fail-safe technique by which, in an electronic device having the semiconductor device described in the first embodiment installed therein, the operation of the semiconductor device safely stops when the coupling failure of the supply terminal TC or the ground terminal TS in the semiconductor device is detected. Hereinafter, the fifth embodiment will be described in detail with reference to FIGS. 18 to 20.

Figure 18:
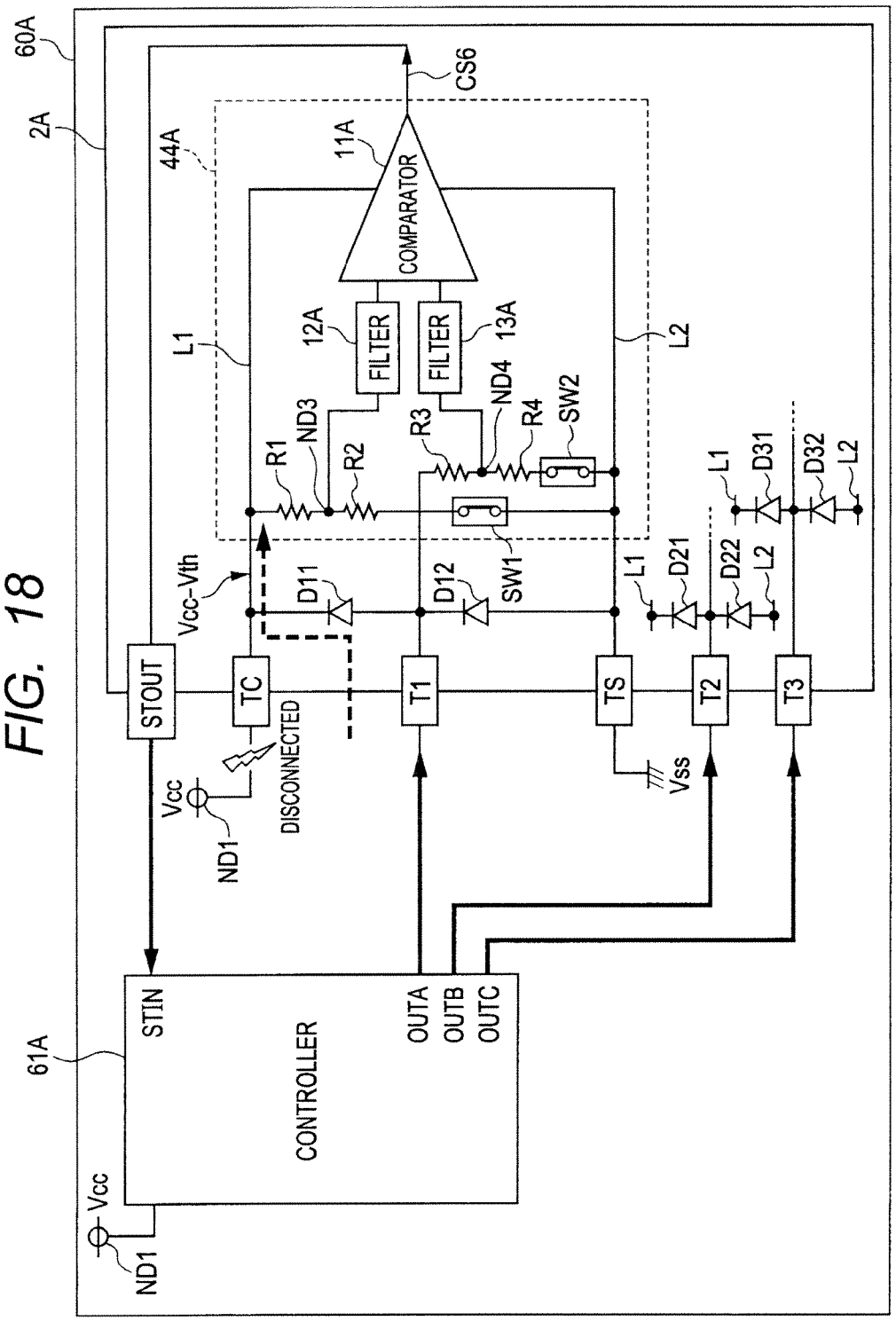
FIG. 18 is a block diagram illustrating a configuration of an electronic device according to a fifth embodiment of the present invention.

FIG. 18 is a block diagram illustrating a configuration of an electronic device according to the fifth embodiment of the present invention. The electronic device of FIG. 18 includes semiconductor devices 2A and 61A mounted on a printed circuit board 60A. The semiconductor device 2A is a microcomputer chip accommodated in a semiconductor package, and the semiconductor device 61A is a controller that controls the semiconductor device 2A.

The semiconductor device 2A modifies the semiconductor device of FIG. 5, and includes a voltage test unit 44A instead of the voltage test unit 40A. The voltage test unit 44A is obtained by removing the D flip-flop 14 from the voltage test unit 40A. The status signal CS6 output from the comparator 11A is input to an input terminal STIN of the semiconductor device 61A through an output terminal STOUT.

The semiconductor device 2A includes I/O terminals T1 to T3. As described in FIGS. 1 and 2, the parasitic diodes D11, D21, and D31 are disposed between the I/O terminals T1 to T3 and the supply terminal TC, respectively, so that the supply terminal TC is arranged on the cathode side thereof. The parasitic diodes D12, D22, and D32 are disposed between the I/O terminals T1 to T3 and the ground terminal TS, respectively, so that the ground terminal TS (ground wiring L2) is arranged on the anode side thereof. Signals are supplied to the I/O terminals T1 to T3 from the output terminals OUTA, OUTB, and OUTC of the semiconductor device 61A, respectively.

In an initial state, it is assumed that a signal of the H level equal to the supply voltage Vcc is input to the I/O terminal T1 of the semiconductor device 2A from the output terminal OUTA of the semiconductor device 61A, and a signal of the L level equal to the ground voltage Vss is input to the I/O terminals T2 and T3 from the output terminals OUTB and OUTC, respectively. In this state, the voltage test unit 44A of the semiconductor device 2A determines whether or not the voltage of the supply terminal TC is lower than the voltage of the I/O terminal T1. If the solder joint of the supply terminal TC is in failure and disconnected, the comparator 11A disposed in the voltage test unit 44A outputs the status signal CS6 of the H level to the semiconductor device 61A.

Upon receiving the status signal CS6 of the H level, the semiconductor device 61A also switches the signals to be supplied to the I/O terminals T2 and T3 from the L level to the H level. With this operation, since the amount of current to be supplied to the supply wiring L1 is increased, the semiconductor device 2A operates more stably. In this state, the semiconductor device 61A stops the operation of the semiconductor device 2A.

Figure 19:
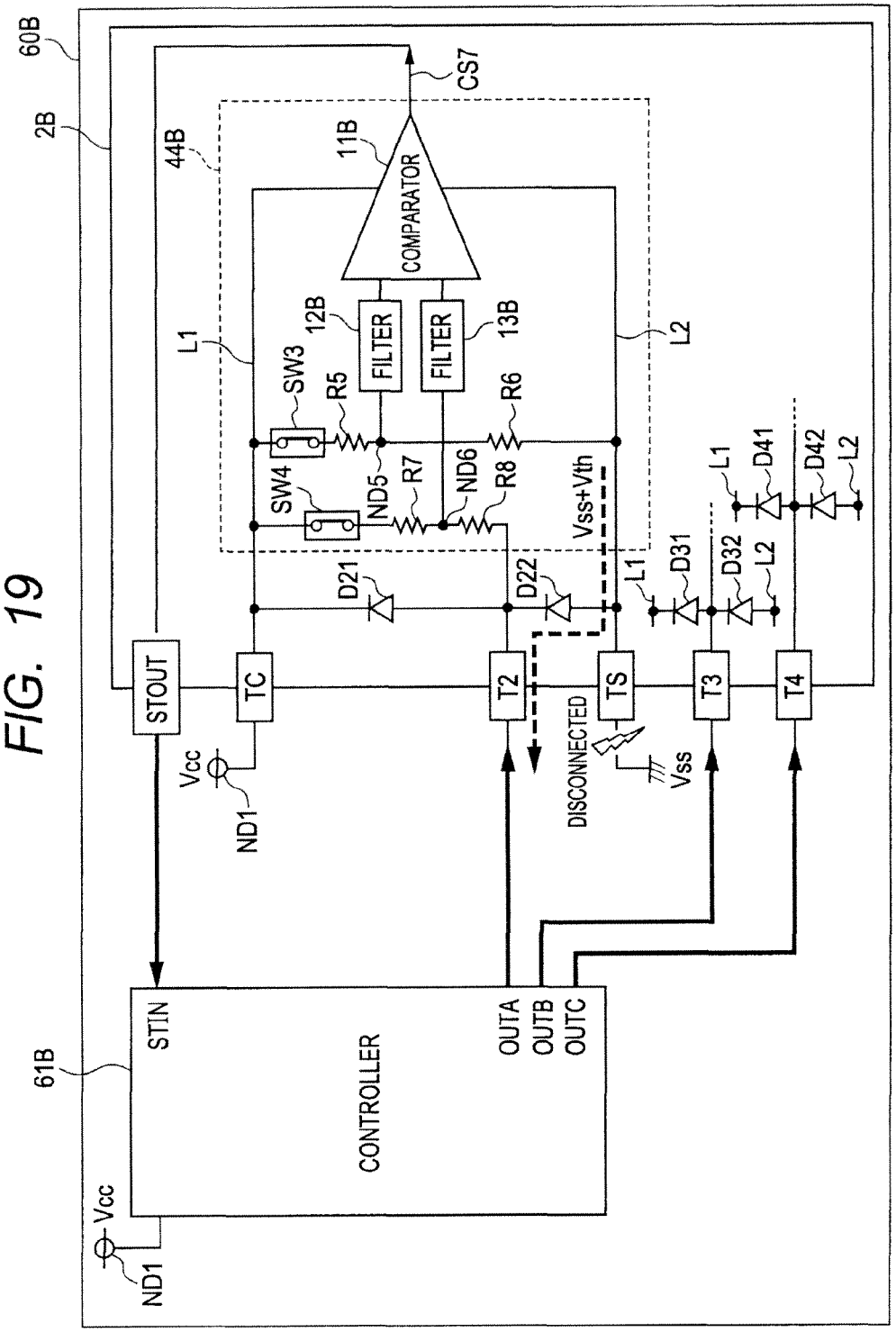
FIG. 19 is a block diagram illustrating one modified example of the electronic device of FIG. 18.

FIG. 19 is a block diagram illustrating one modified example of the electronic device of FIG. 18. The electronic device of FIG. 19 includes semiconductor devices 2B and 61B mounted on a printed circuit board 60B. The semiconductor device 2B is a microcomputer chip accommodated in a semiconductor package, and the semiconductor device 61B is a controller that controls the semiconductor device 2B. The semiconductor device 2B includes a voltage test unit 44B instead of the voltage test unit 44A of FIG. 18. The voltage test unit 44B is obtained by removing the D flip-flop 14 from the voltage test unit 40B. A status signal CS7 output from the comparator 11B is input to an input terminal STIN of the semiconductor device 61B through an output terminal STOUT.

In an initial state, it is assumed that a signal of the L level equal to the ground voltage Vss is input to the I/O terminal T2 of the semiconductor device 2B from the output terminal OUTA of the semiconductor device 61B, and a signal of the H level equal to the supply voltage Vcc is input to the I/O terminals T3 and T4 from the output terminals OUTB and OUTC, respectively. In this state, the voltage test unit 44B of the semiconductor device 2B determines whether or not the voltage of the ground terminal TS is higher than the voltage of the I/O terminal T2. If the solder joint of the ground terminal TS is in failure and disconnected, the comparator 113 disposed in the voltage test unit 44B outputs the status signal CS7 of the H level to the semiconductor device 61B.

When receiving the status signal CS7 of the H level, the semiconductor device 61B also switches the signals to be supplied to the I/O terminals T3 and T4 from the H level to the L level. With this operation, since the amount of current to be supplied to the ground wiring L2 is increased, the semiconductor device 2B more stably operates. In this state, the semiconductor device 61B stops the operation of the conductor device 2B.

Figure 20:
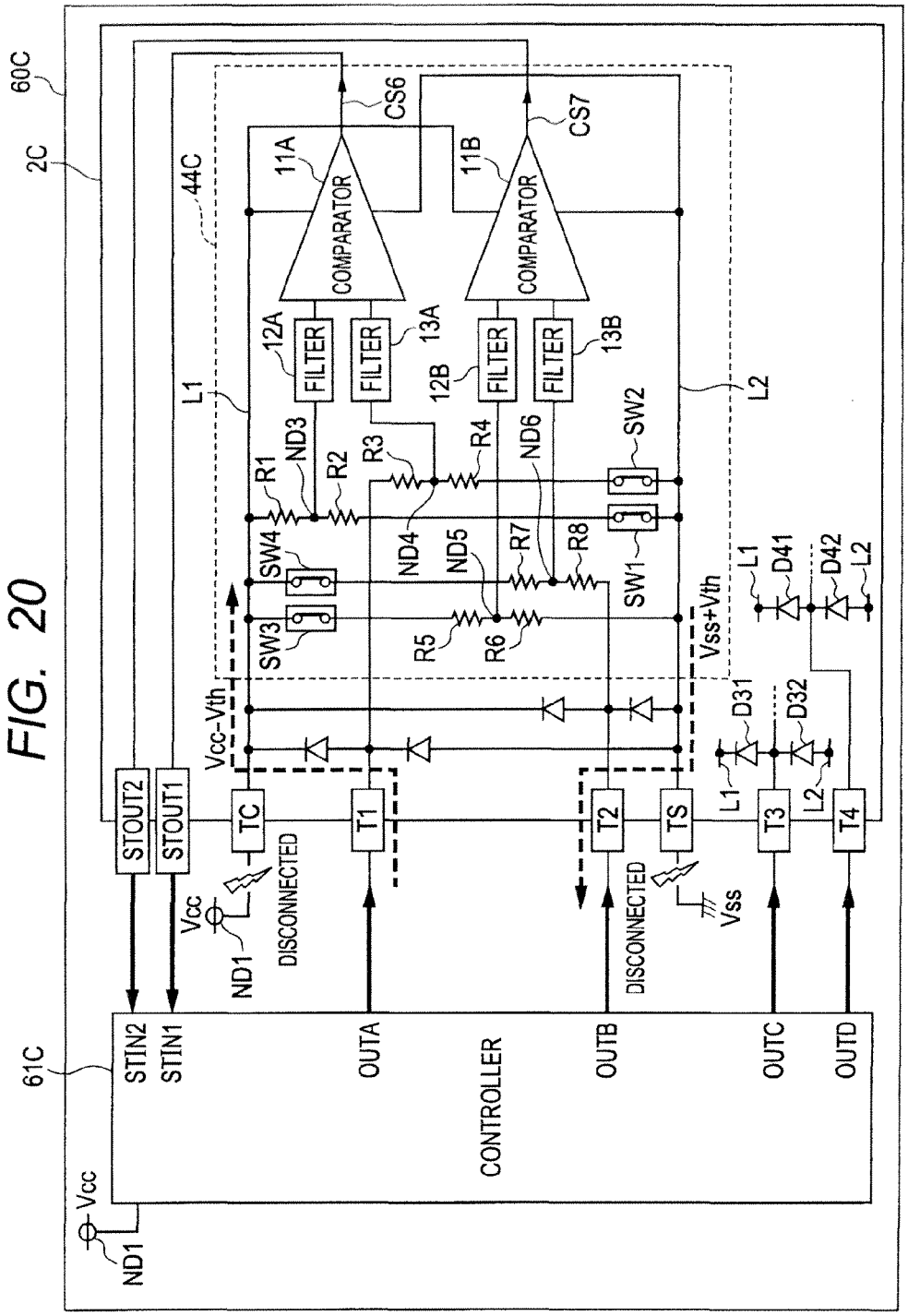
FIG. 20 is a block diagram illustrating another modified example of the electronic device of FIG. 18.

FIG. 20 is a block diagram illustrating another modified example of the electronic device of FIG. 18. The electronic device of FIG. 20 includes semiconductor devices 2C and 61C mounted on a printed circuit board 60C. The semiconductor device 2C is a microcomputer chip accommodated in a semiconductor package, and the semiconductor device 61C is a controller that controls the semiconductor device 2C. The semiconductor device 2C includes a voltage test unit 44C instead of the voltage test unit 44A of FIG. 18. The voltage test unit 44C is obtained by removing the OR circuit 15 and the D flip-flop 14 from the voltage test unit 400. The status signal CS6 output from the comparator 11A is input to an input terminal STIN1 of the semiconductor device 61C through an output terminal STOUT1. The status signal CS7 output from the comparator 11B is input to an input terminal STIN2 of the semiconductor device 61C through an output terminal STOUT2.

In an initial state, it is assumed that a signal of the H level equal to the supply voltage Vcc is input to the I/O terminal T1 of the semiconductor device 2C from the output terminal OUTA of the semiconductor device 61C, and a signal of the L level equal to the ground voltage Vss is input to the I/O terminal T2 of the semiconductor device 2C from the output terminal OUTB of the semiconductor device 61C. It is assumed that signals of the same H level or the same L level are input to the I/O terminals T3 and T4 from the output terminals OUTC to and OUTD of the semiconductor device 61C.

In this state, the voltage test unit 44C of the semiconductor device 2C determines whether or not the voltage of the supply terminal TC is lower than the voltage of the I/O terminal T1, and determines whether or not the voltage of the ground terminal TS is higher than the voltage of the I/O terminal T2. If the solder joints of both the supply terminal TC and the ground terminal TS are in failure and disconnected, the comparator 11A disposed in the voltage test unit 44C outputs the status signal CS6 of the H level to the semiconductor device 61C, and the comparator 11B outputs the status signal CS7 of the H level to the semiconductor device 61C.

When receiving both of the status signal CS6 of the H level and the status signal CS7 of the H level, the semiconductor device 61C switches the level of the signal to be supplied to the I/O terminal T3 to the H level, and switches the level of the signal to be supplied to the I/O terminal T4 to the L level. With this operation, the amounts of current to be supplied to the supply wiring L1 and the ground wiring 52 are stable, and therefore the semiconductor device 2B more stably operates. In this state, the semiconductor device 61B stops the operation of the semiconductor device 2B. If the semiconductor device 61C supplies signals to a larger number of I/O terminals disposed in the semiconductor device 2C, the semiconductor device 61C changes a logic level of the output signal so that the number of I/O terminals to be switched to the H level is equal to the number of I/O terminals to be switched to the L level.

Sixth Embodiment

A sixth embodiment pertains to a fail-safe technique by which the operation of the semiconductor device safely stops when the coupling failure of the supply terminal TC or the ground terminal TS of the semiconductor device is detected. Hereinafter, the sixth embodiment will be described in detail with reference to FIGS. 21 to 23.

Figure 21:
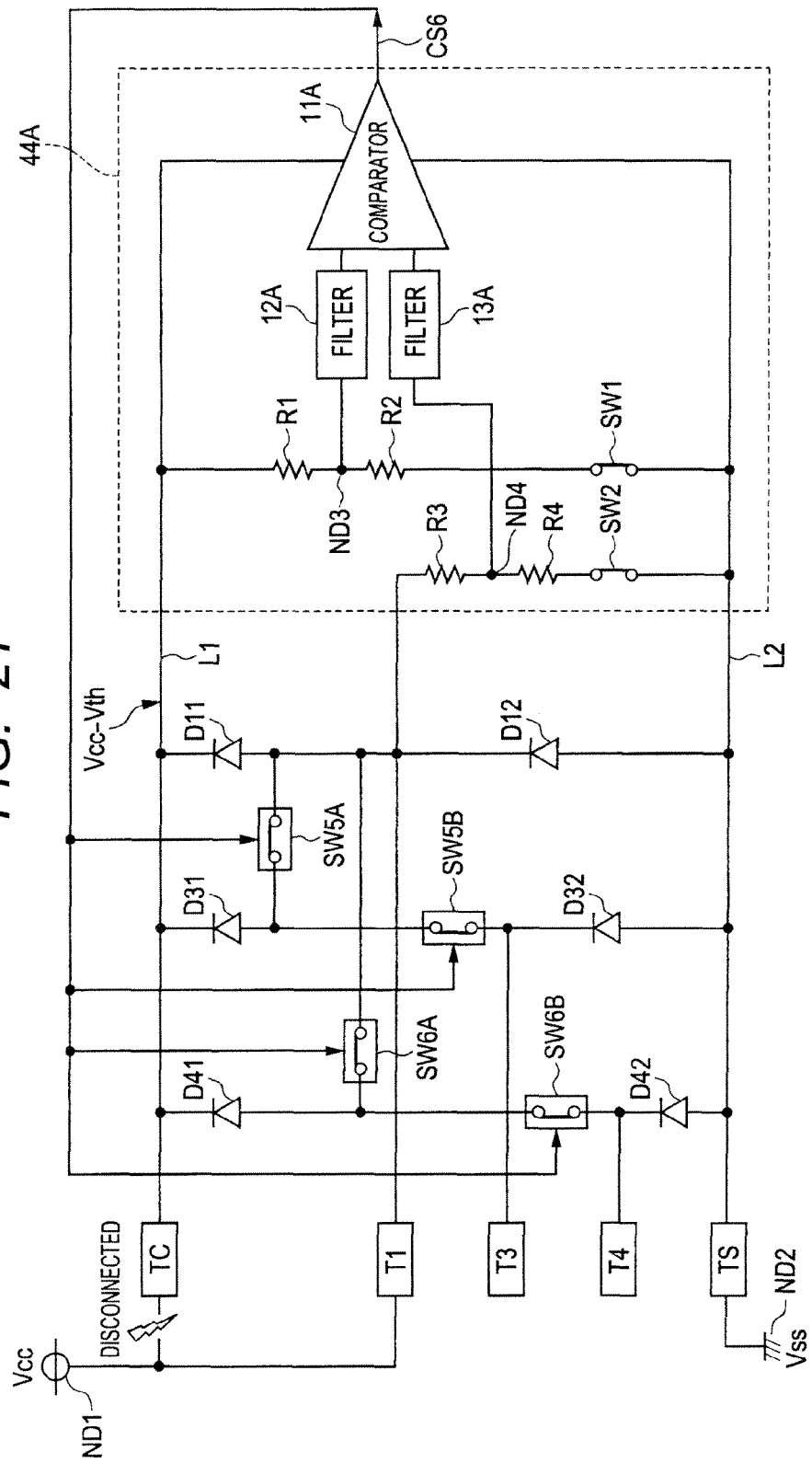
FIG. 21 is a block diagram illustrating a configuration of a semiconductor device according to a sixth embodiment of the present invention.

FIG. 21 is a block diagram illustrating a configuration of a semiconductor device according to the sixth embodiment of the present invention. The semiconductor device of FIG. 21 modifies the semiconductor device of FIG. 5, and includes the voltage test unit 44A instead of the voltage test unit 40A. The voltage test unit 44A is obtained by removing the D flip-flop 14 from the voltage test unit 40A. The semiconductor device of FIG. 21 illustrates the I/O terminals 13 and T4 together. The parasitic diodes D31 and D41 are disposed between the I/O terminals T3, T4 and the supply terminal TC, respectively, and the parasitic diodes D32 and D42 are disposed between the I/O terminals T3, T4 and the ground terminal TS, respectively.

The semiconductor device of FIG. 21 further includes switches SW5A, SW5B, SW6A, and SW6B. The switch SW5B is disposed between an anode of the diode D31 and a cathode of the diode D32. The switch SW5A is disposed between an anode of the diode D11 and a coupling node of the diode D31 and the switch SW5B. The I/O terminal T3 is coupled to a coupling node of the switch SW5B and the diode D32. The switch SW6B is disposed between an anode of the diode D41 and a cathode of the diode D42. The switch SW6A is disposed between an anode of the diode D11 and a coupling node of the diode D41 and the switch SW6B. The I/O terminal T4 is coupled to a coupling node of the switch SW6B and the diode D42.

The voltage test unit 44A determines whether or not the voltage of the supply terminal TC is lower than the voltage of the I/O terminal T1. If the solder joint of the supply terminal TC is in failure and disconnected, the comparator 11A disposed in the voltage test unit 44A outputs the status signal CS6 of the H level to the switches SW5A, SW5B, SW6A, and SW6B. The switches SW5B and SW6B turn on upon receiving the status signal CS6 of the H level. With this operation, since the supply wiring L1 and the supply terminal TC are coupled to each other through the diodes D11, D31, and D41, the amount of current to be supplied to the supply wiring L1 is increased. Thus, after the semiconductor device has more stably operated, the operation of the semiconductor device stops.

Figure 22:
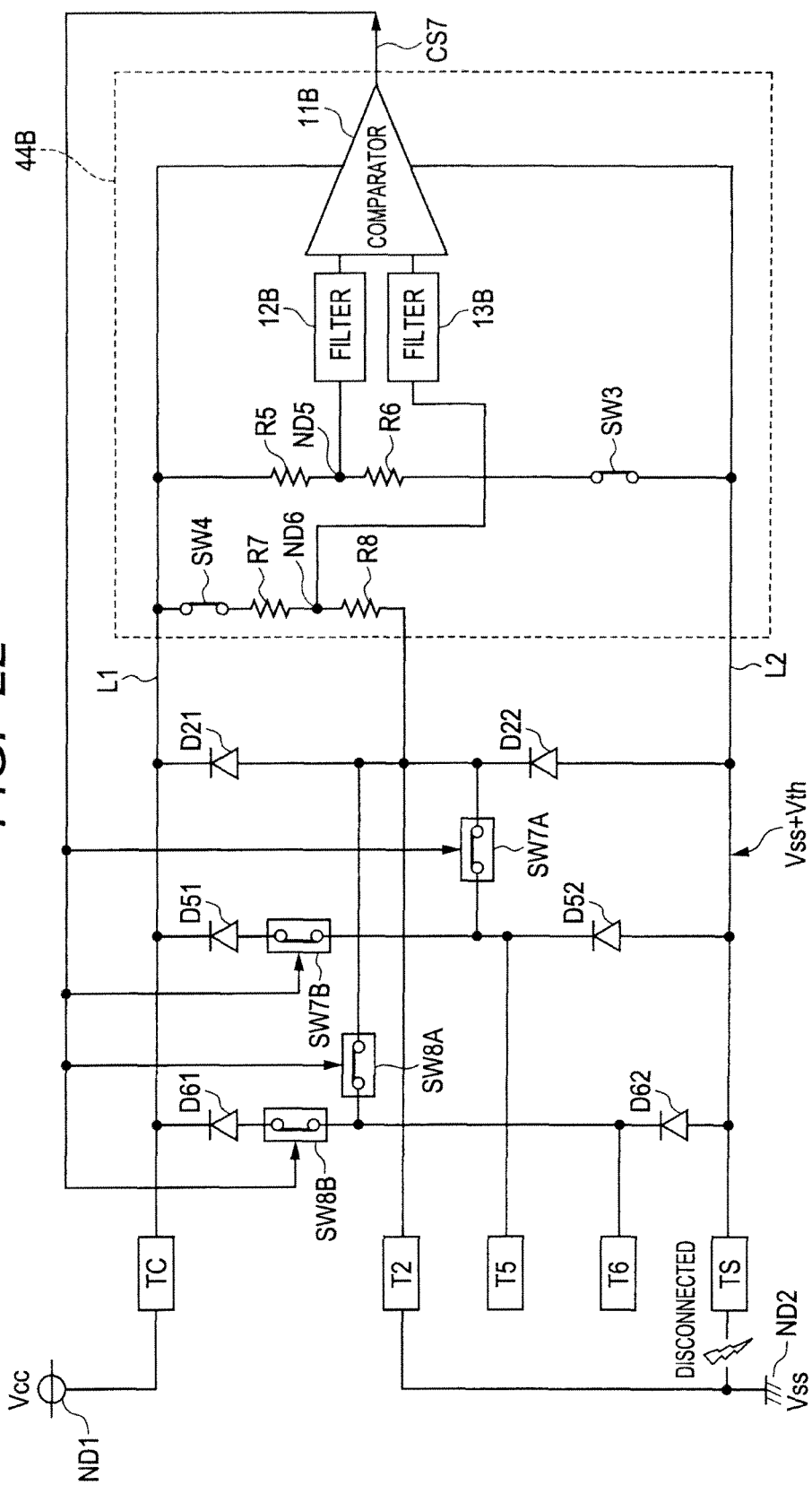
FIG. 22 is a block diagram illustrating another example of a semiconductor device according to the sixth embodiment of the present invention.

FIG. 22 is a block diagram illustrating another example of a semiconductor device according to the sixth embodiment of the present invention. The semiconductor device of FIG. 22 modifies the semiconductor device of FIG. 6, and includes the voltage test unit 44B instead of the voltage test unit 40B. The voltage test unit 44B is obtained by removing the D flip-flop 14 from the voltage test unit 40B. The semiconductor device of FIG. 22 illustrates the I/O terminals T5 and T6 together. Diodes D51 and D61 are disposed between the I/O terminals T5, T6 and the supply terminal TC, respectively, and diodes D52 and D62 are disposed between the I/O terminals T5, T6 and the ground terminal TS, respectively.

The semiconductor device of FIG. 22 further includes switches SW7B, SW7B, SW8B, and SW8B. The switch SW7B is disposed between an anode of the diode D51 and a cathode of the diode D52. The switch SW7A is disposed between an anode of the diode D21 and a coupling node of the diode D52 and the switch SW7B. The I/O terminal T5 is coupled to a coupling node of the switch SW7B and the diode D52. The switch SW8B is disposed between an anode of the diode D61 and a cathode of the diode D62. The switch SW8A is disposed between an anode of the diode D21 and a coupling node of the diode D62 and the switch SW8B. The I/O terminal T6 is coupled to a coupling node of the switch SW8B and the diode D62.

The voltage test unit 44B determines whether or not the voltage of the ground terminal TS is higher than the voltage of the I/O terminal T2. If the solder joint of the ground terminal TS is in failure and disconnected, the comparator 11B disposed in the voltage test unit 44B outputs the status signal CS7 of the H level to the switches SW7A, SW7B, SW8A, and SW8B. The switches SW7A and SW8A turn on when receiving the status signal CS7 of the H level, and the switches SW7B and SW8B turn off when receiving the status signal CS7 of the H level. With this operation, since the ground wiring L2 and the ground terminal TS are coupled to each other through the diodes D22, D52, and D62, the amount of current to be supplied to the ground wiring L2 is increased. Thus, after the semiconductor device has more stably operated, the operation of the semiconductor device stops.

Figure 23:
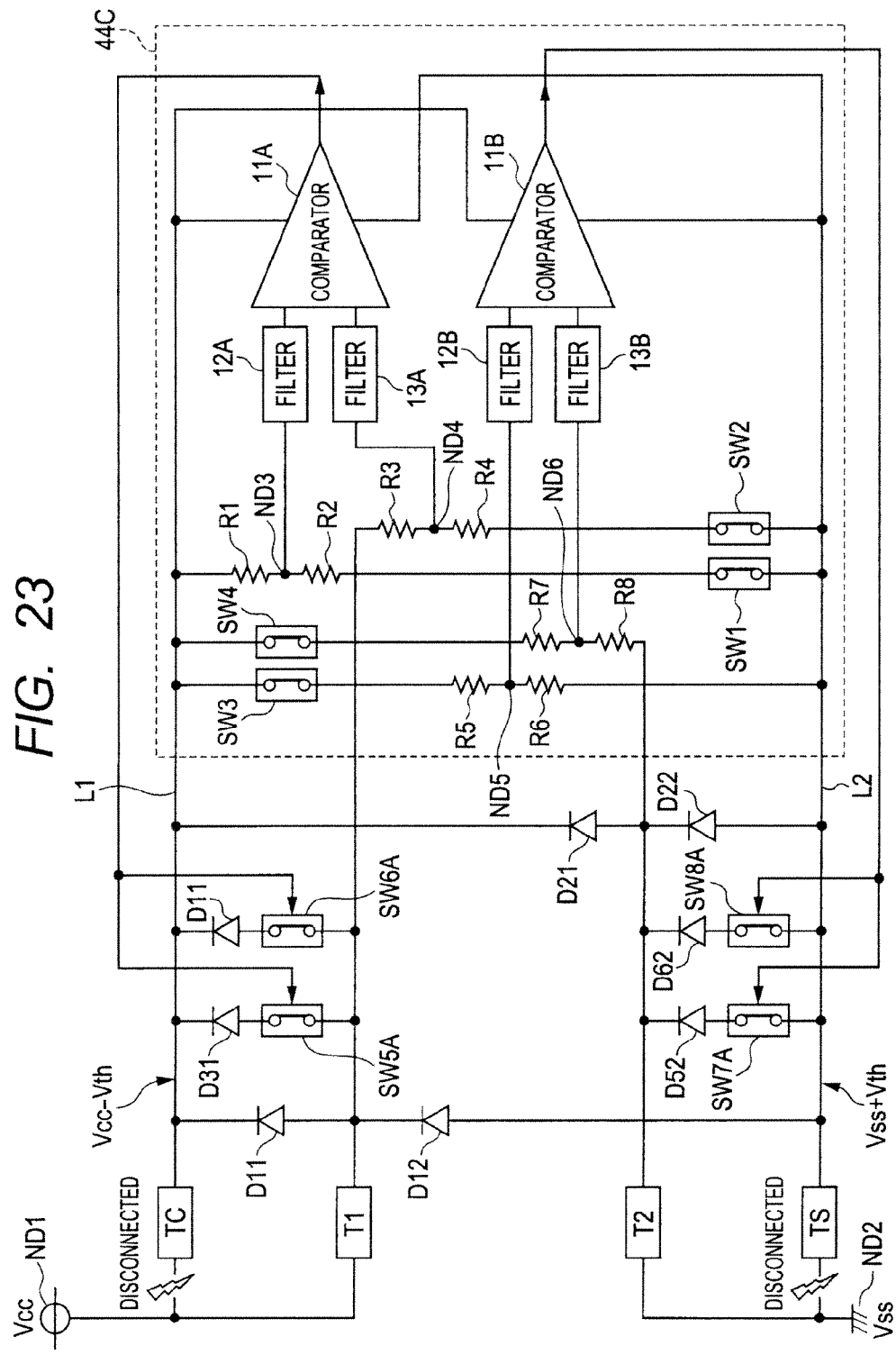
FIG. 23 is a block diagram illustrating still another example of a semiconductor device according to the sixth embodiment of the present invention.

FIG. 23 is a block diagram illustrating still another example of a semiconductor device according to the sixth embodiment of the present invention. The semiconductor device of FIG. 23 is the combination of the semiconductor device of FIG. 21 with the semiconductor device of FIG. 22. For facilitation of illustration, in FIG. 23, the I/O terminals T3, T4, the switches SW5B, SW6B, and the diodes D32, D42 in FIG. 21 are omitted, and the I/O terminals T5, T6, the switches SW7B, SW8B, and the diodes D51, D61 in FIG. 23 are omitted.

The voltage test unit 44C determines whether or not the voltage of the supply terminal TC is lower than the voltage of the I/O terminal T1, and determines whether or not the voltage of the ground terminal TS is higher than the voltage of the I/O terminal T2. If the solder joints of both the supply terminal TC and the ground terminal TS are in failure and disconnected, the comparator 11A disposed in the voltage test unit 44C outputs the status signal CS6 of the H level to the switches SW5A and SW6A, and the comparator 11B outputs the status signal CS7 of the H level to the switches SW7A and SW8A. The switches SW5A and SW6A turn on upon receiving the status signal CS6 of the H level, and the switches SW7A and SW8A turn on upon receiving the status signal CS7 of the H level. With this operation, the supply wiring L1 and the supply terminal TC are coupled to each other through the diodes D11, D31, and D41, and the ground wiring L2 and the ground terminal TS are coupled to each other through the diodes D22, D52, and D62. As a result, the amounts of current to be supplied to the supply wiring L1 and the ground wiring L2 are increased. Thus, after the semiconductor device has more stably operated, the operation of the semiconductor device stops.

Seventh Embodiment

In a seventh embodiment, a description will be given of a test technique for testing whether the voltage test unit normally operates or not before shipping the semiconductor device having the voltage test unit described above.

Figure 24:
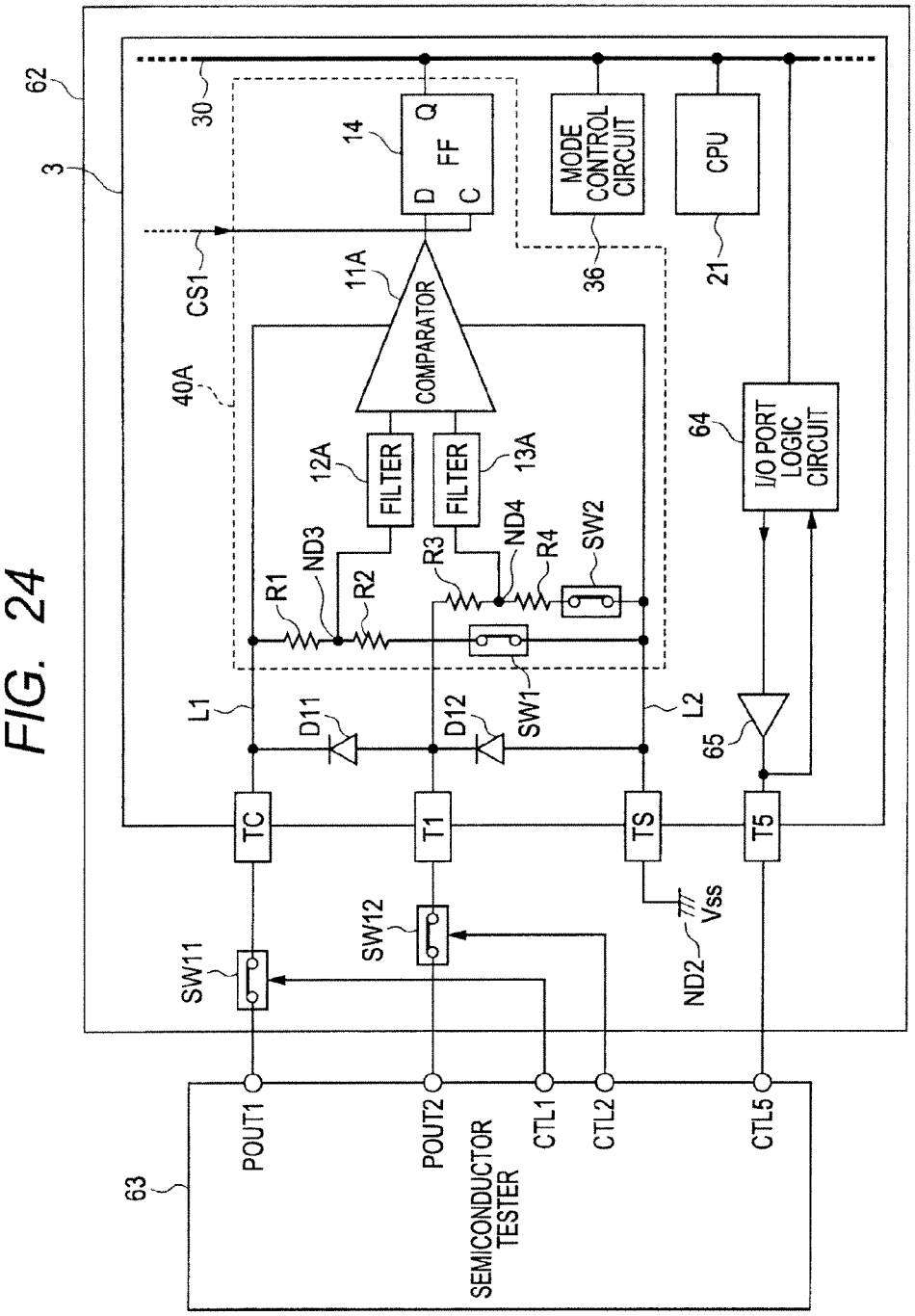
FIG. 24 is a block diagram illustrating a configuration of a test system for testing whether the voltage test unit of FIG. 5 operates normally or not.

FIG. 24 is a block diagram illustrating a configuration of a test system for testing whether the voltage test unit 40A of FIG. 5 operates normally or not. The test system of FIG. 24 includes a semiconductor device 3 that is equipped with the voltage test unit 40A described in FIG. 5, a test board 62 that can install the semiconductor device 3, and a semiconductor tester 63.

The semiconductor device 3 includes, in addition to the configuration of the semiconductor device described in FIG. 5, the CPU 21, the mode control circuit 36, an I/O port logic circuit 64, an output buffer 65, and the I/O terminal T5. The semiconductor device 3 has, as operation modes, a normal mode and a power saving mode smaller in power consumption than the normal mode, and those operation modes are switched by the mode control circuit 36. The I/O port logic circuit 64 is coupled to the bus 30, and used as an interface when the semiconductor device 3 inputs and outputs a signal through the I/O terminal T5. The I/O terminal T5 is coupled to a control terminal CTL5 of the semiconductor tester 63.

The test board 62 is equipped with switches SW11 and SW12 that turn on or off according to control signals output from control terminals CTL1 and CTL2 of the semiconductor tester 63. The switch SW11 is coupled to a power output terminal POUT1 of the semiconductor tester 63 and the supply terminal TC of the semiconductor device 3, and the switch SW12 is coupled to a power output terminal POUT2 of the semiconductor tester 63 and the I/O terminal T1 of the semiconductor device 3.

The semiconductor tester 63 outputs magnitude-variable supply voltages from the power output terminals POUT1 and POUT2. The semiconductor tester 63 further communicates with the semiconductor device 3 through the control terminal CTL5. During testing the semiconductor device 3, the CPU 21 and the mode control circuit 36 operate upon receiving an instruction from the semiconductor tester 63, and a test result from the voltage test unit 40A is output to the semiconductor tester 63.

Figure 25:
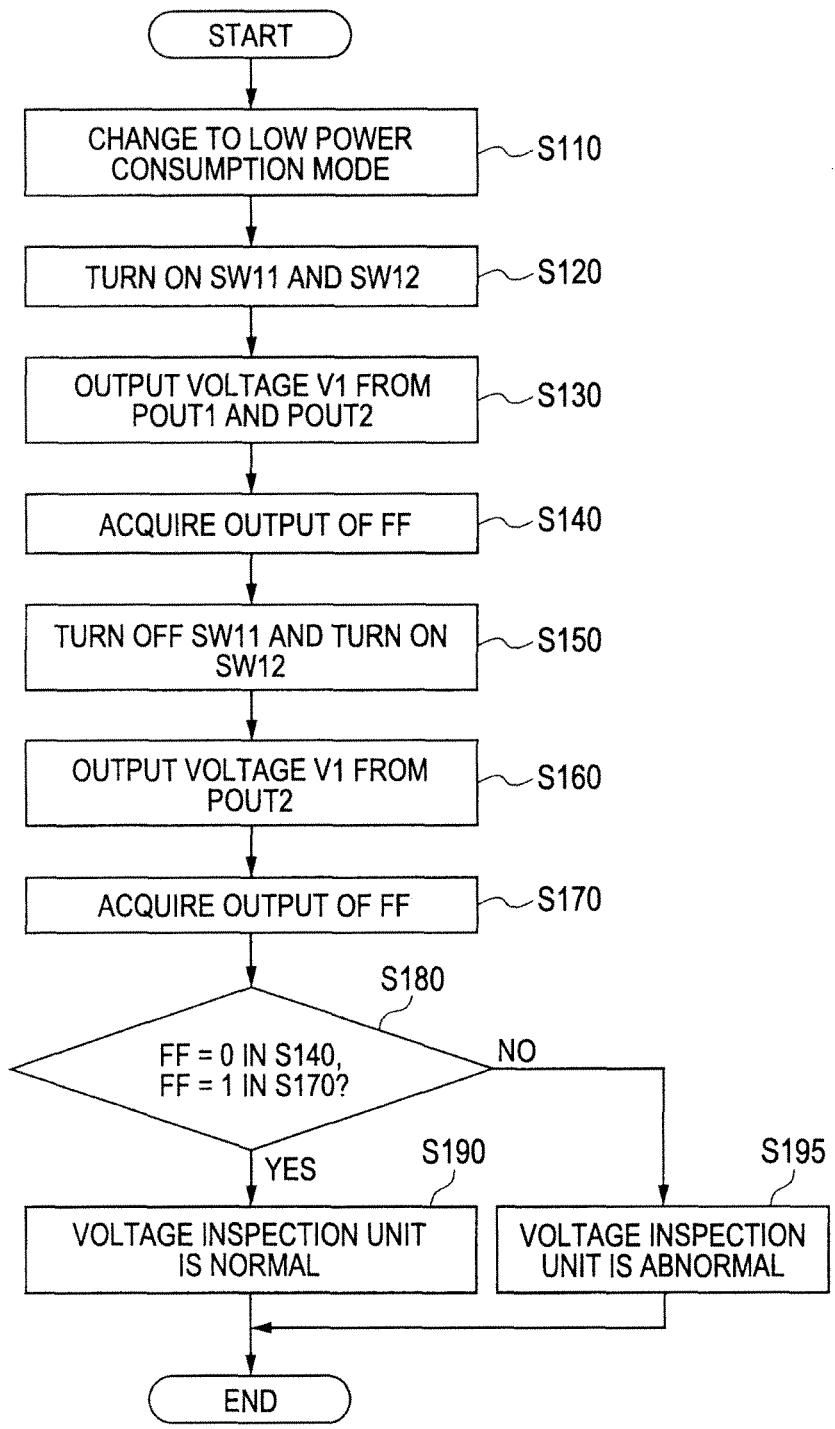
FIG. 25 is a flowchart illustrating a test procedure in the test system of FIG. 21.

FIG. 25 is a flowchart illustrating a test procedure in the test system of FIG. 21. Referring to FIGS. 24 and 25, in Step S110, the mode control circuit 36 first switches the operation mode of the semiconductor device 3 to a low power consumption mode (power saving mode) so that the semiconductor device 3 stably operates during test. The Step S110 is executed in advance in preparation to decrease the amount of current to be supplied to the supply wiring L1 of the semiconductor device 3 in Steps S160 and S170 which will be described later.

In subsequent Step S120, the semiconductor tester 63 turns on both of the switches SW11 and SW12 on the test board 62.

In subsequent Step S130, the semiconductor tester 63 outputs voltages V1 (normally equal to supply voltage Vcc) from the power output terminals POUT1 and POUT2 to the supply terminal TC and the I/O terminal T1 in the semiconductor device 3, respectively. The voltage test unit 40A disposed in the semiconductor device 3 compares the voltage of the supply terminal TC with the voltage of the I/O terminal T1. The comparator 11A outputs a signal of the L level ("0") when the voltage of the supply terminal TC is equal to the voltage of the I/O terminal T1, and outputs a signal of the H level ("1") when the voltage of the supply terminal TC is lower than the voltage of the I/O terminal T1. An output of the comparator 11A is held in the D flip-flop (FF) 14.

In subsequent Step S140, the semiconductor tester 63 acquires an output of the D flip-flop 14.

In subsequent Step S150, the semiconductor tester 63 turns off the switch SW11 on the test board 62, and turns on the switch SW12. As a result, the supply terminal TC of the semiconductor device 3 is opened.

In subsequent Step S160, the semiconductor tester 63 outputs the voltage V1 (supply voltage Vcc) from the power output terminal POUT2 to the I/O terminal T1 in the semiconductor device 3. The voltage test unit 40A disposed in the semiconductor device 3 compares the voltage of the supply terminal TC with the voltage of the I/O terminal T1. The comparator 11A outputs a signal of the L level ("0") when the voltage of the supply terminal TC is equal to the voltage of the I/O terminal T1, and outputs a signal of the H level ("1") when the voltage of the supply terminal TC is lower than the voltage of the I/O terminal T1. An output of the comparator 11A is held in the D flip-flop (FF) 14.

In subsequent Step S170, the semiconductor tester 63 acquires an output of the D flip-flop 14.

In subsequent Step S180, the semiconductor tester 63 determines whether or not determination conditions that the output of the D flip-flop 14, which is acquired in Step S140, is "0", and the output of the D flip-flop 14, which is acquired in Step S170, is "1", are satisfied. If the determination conditions are satisfied (yes in Step S180), it is determined that the voltage test unit 40A is normal (Step S190). If the determination conditions are not satisfied (no in Step S180), it is determined that the voltage test unit 40A is abnormal (Step S195).

Modified Example 1

Figure 26:
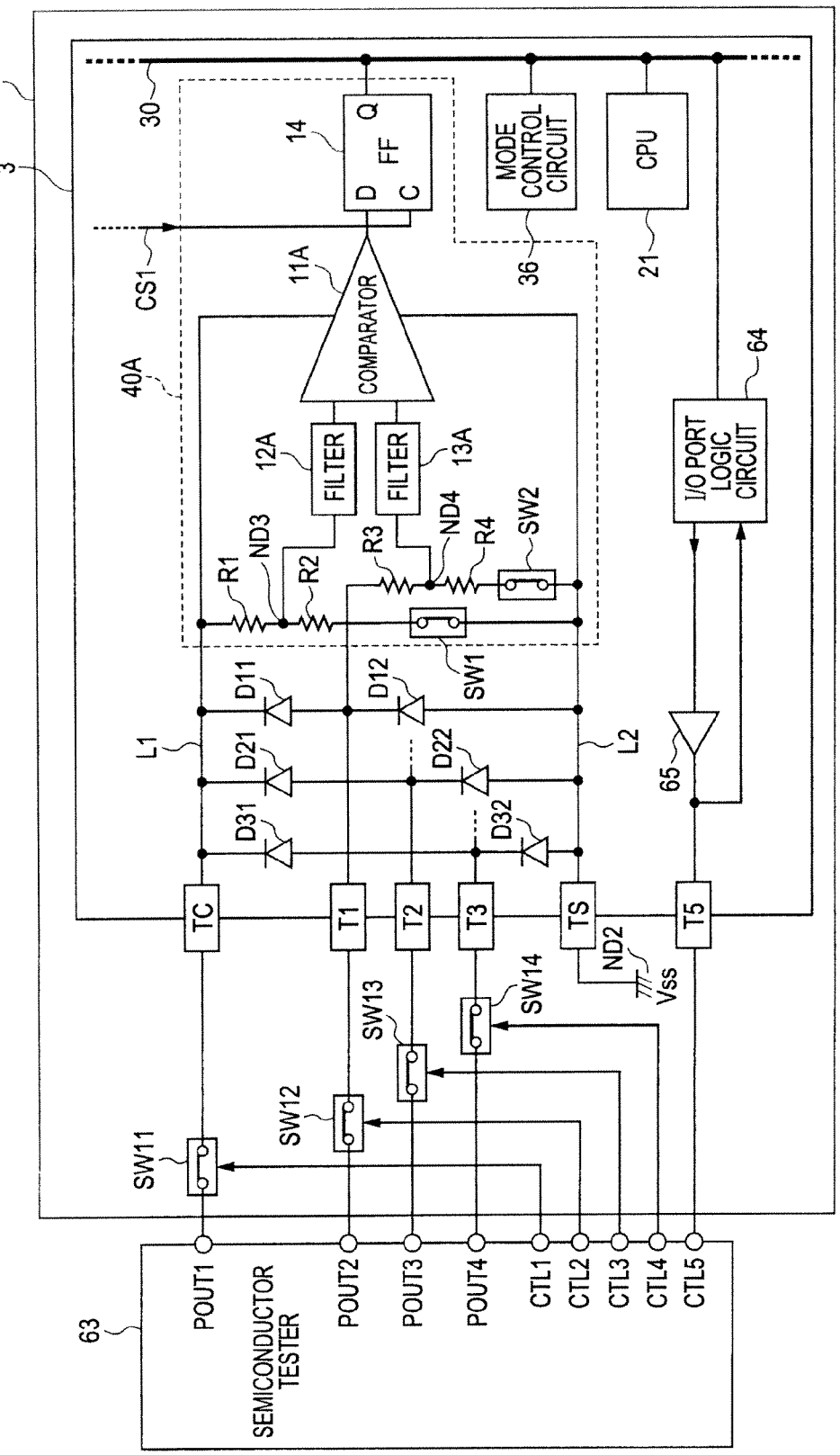
FIG. 26 is a block diagram illustrating a first modified example of the test system.

FIG. 26 is a block diagram illustrating a first modified example of the test system. The semiconductor device of FIG. 26 further includes the I/O terminals T2 and T3. The parasitic diodes D21 and D31 are disposed between the I/O terminals T2, T3 and the supply wiring L1, respectively, and the parasitic diodes D22 and D32 are disposed between the I/O terminals T2, T3 and the ground wiring L2, respectively.

A test board 66 is equipped with switches SW13 and SW14 that turn on or off according to control signals output from control terminals CTL3 and CTL4 of the semiconductor tester 63. The switch SW13 is coupled to a power output terminal POUT3 of the semiconductor tester 63 and the I/O terminal T3 of the semiconductor device 3, and the switch SW12 is coupled to the power output terminal POUT4 of the semiconductor tester 63 and the I/O terminal T3 of the semiconductor device 3.

The semiconductor tester 63 outputs magnitude-variable supply voltages from the power output terminals POUT1 to POUT4. The other configurations in FIG. 26 are identical with those of the semiconductor device described in FIG. 24, and therefore identical or corresponding parts are denoted by the same reference numerals or symbols, and their description will not be repeated.

Figure 27:
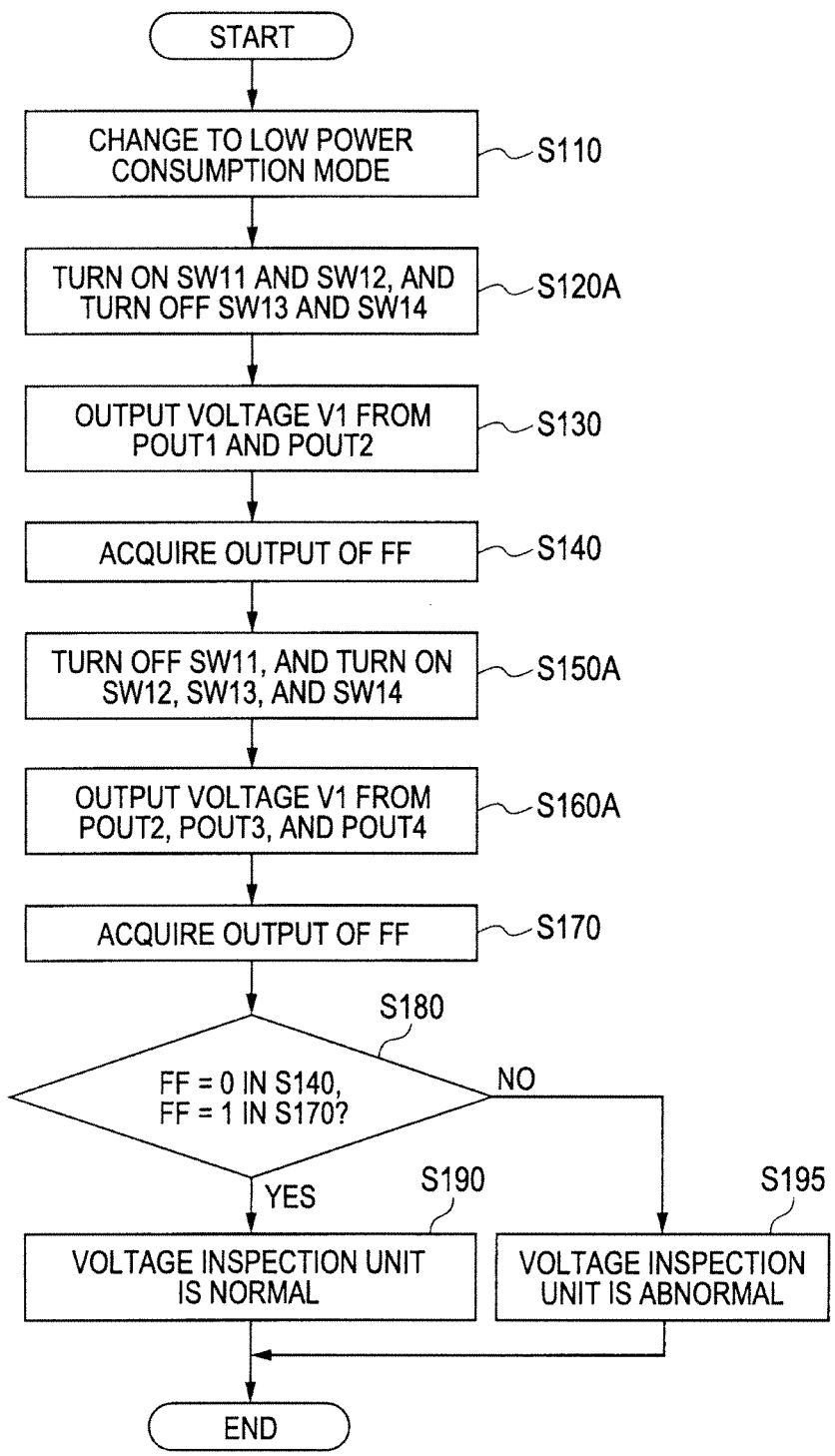
FIG. 27 is a flowchart illustrating a test procedure in the test system of FIG. 26.

FIG. 27 is a flowchart illustrating a test procedure in the test system of FIG. 26. The test procedure of FIG. 27 includes Steps S120A, S150A, and S160A instead of Steps S120, S150, and S160 of FIG. 25. The other steps in FIG. 27 are identical with those in FIG. 25, and therefore are denoted by the same reference symbols, and their description will not be repeated.

In Step S120A, the semiconductor tester 63 turns on both of the switches SW11 and SW12 on the test board 62, and turns off the switches SW13 and SW14.

In Step S150A, the semiconductor tester 63 turns off the switch SW11 on the test board 62, and turns on the switches SW12, SW13, and SW14. With this operation, the supply terminal TC of the semiconductor device 3 is opened.

In Step S160A, the semiconductor tester 63 outputs the voltages V1 (normally equal to supply voltage Vcc) from the power output terminals POUT2, POUT3, and POUT4 to the I/O terminals T1, T2, and T3 of the semiconductor device 3.

According to the above procedure, since the amount of current to be supplied to the supply wiring L1 in Steps S160A and S170 is increased, the semiconductor device 3 can more stably operate.

In Step S120A, all of the switches SW11 to SW14 may be turned on in advance so that the voltages V1 are applied from all of the power output terminals POUT1 to POUT4 in Step S130. Alternatively, the I/O terminals T1, T2, and T3 of the semiconductor device 3 may be coupled to each other on the test board 66 without provision of the switches SW13 and SW14 on the test board 66. In this case, the semiconductor device 3 can be tested in the entirely same procedure as that in FIG. 25.

Modified Example 2

Figure 28:
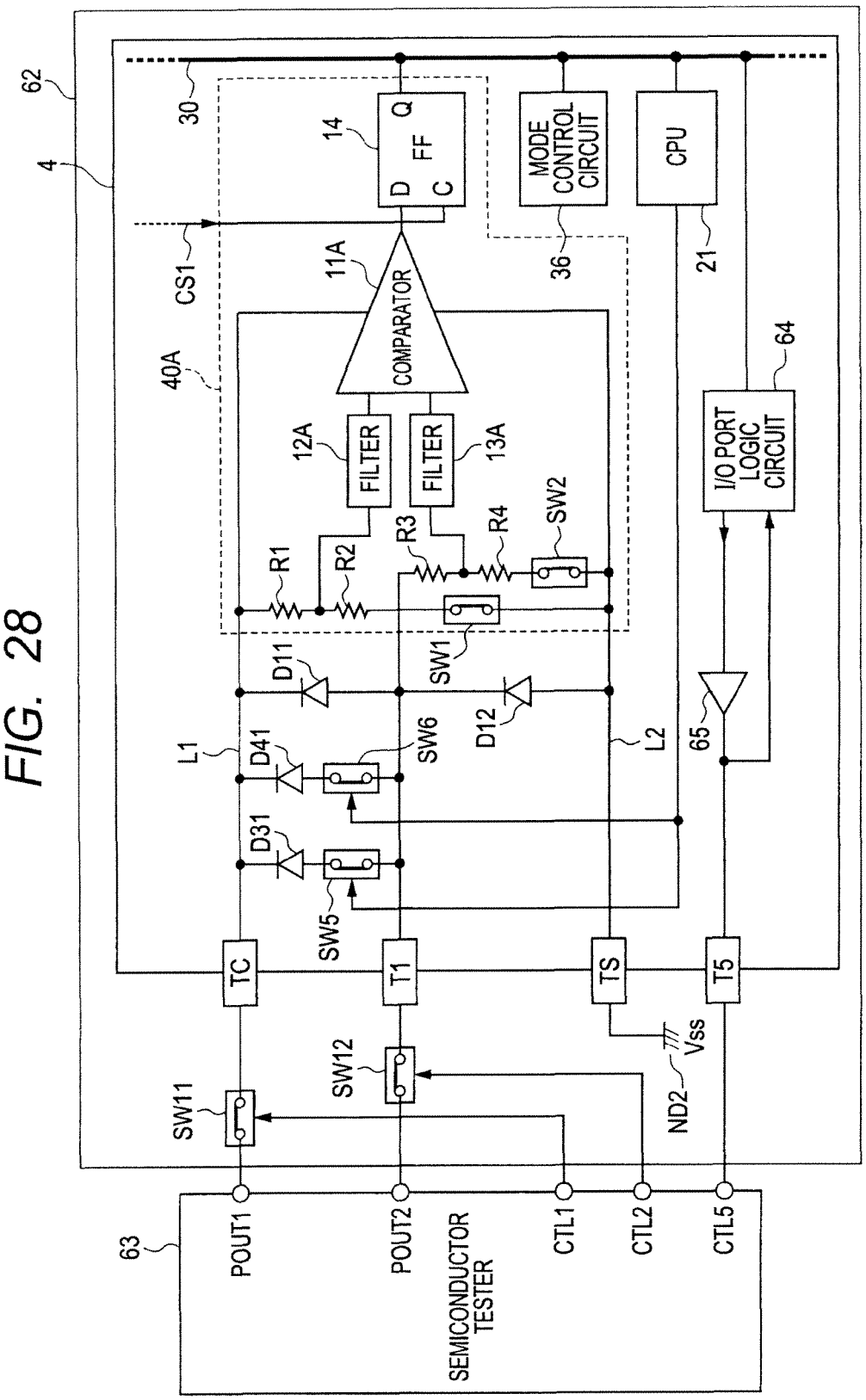
FIG. 28 is a block diagram illustrating a second modified example of the test system.

FIG. 28 is a block diagram illustrating a second modified example of the test system. As in the semiconductor device described in FIG. 21, the semiconductor device of FIG. 28 includes the diodes D31, D41 and the switches SW5, SW6. The diode D31 and the switch SW5 are coupled in series between the supply terminal TC and the I/O terminal T1, and the diode D41 and the switch SW6 are coupled in series between the supply terminal TC and the I/O terminal T1.

Figure 29:
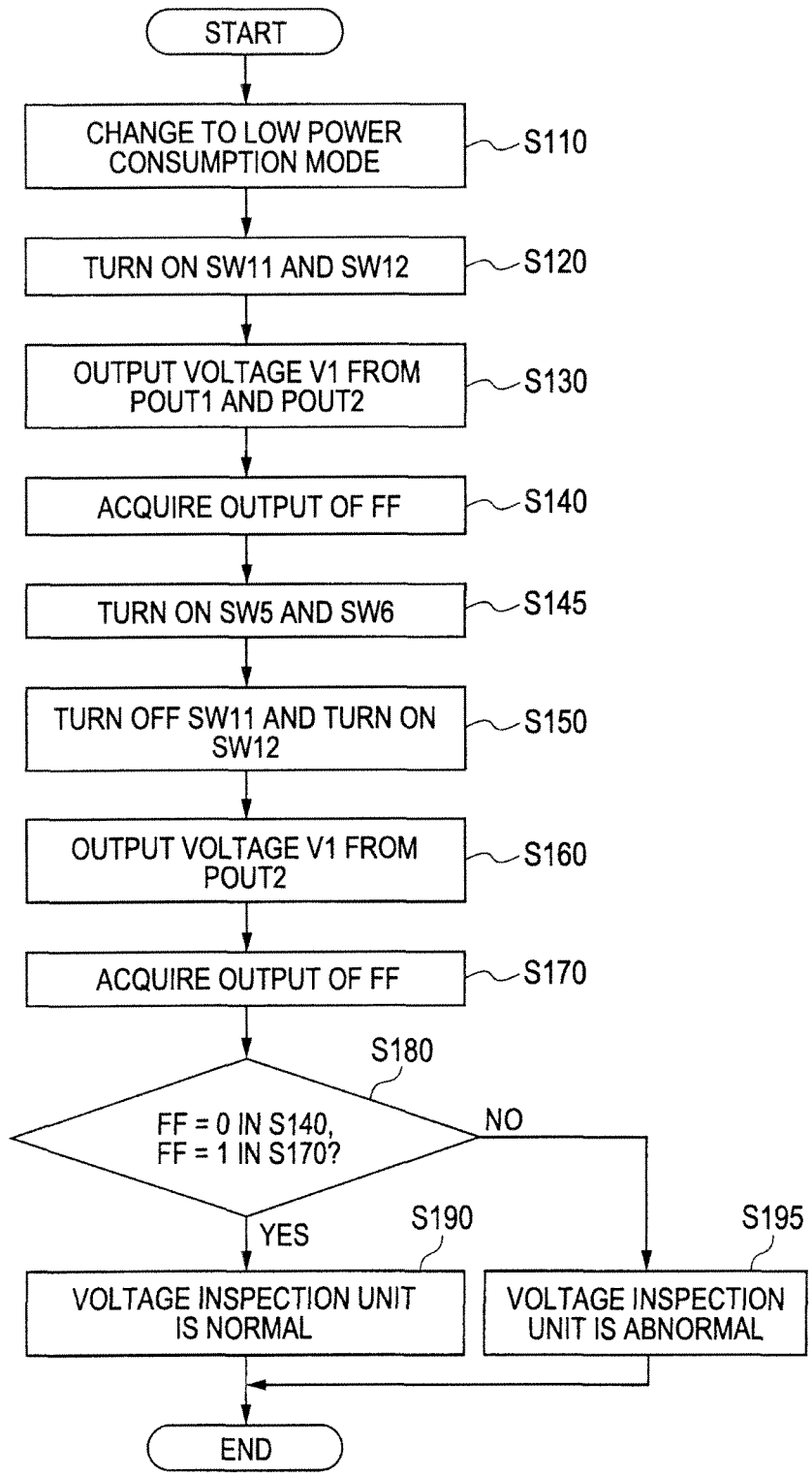
FIG. 29 is a flowchart illustrating a test procedure in the test system of FIG. 28.

FIG. 29 is a flowchart illustrating a test procedure in the test system of FIG. 28. The test procedure of FIG. 29 further includes Step S145 between Step S140 and Step S150 in FIG. 25.

In Step S145, a CPU 4 of the semiconductor device 3 switches the switches SW5 and SW6 from an off state to an on state on the basis of an instruction from the semiconductor tester 63. As a result, since the amount of current to be supplied to the supply wiring L1 is increased in Steps S160 and S170, the semiconductor device 3 can operate more stably.

Step S145 may be provided before Step S120. The other steps in FIG. 27 are identical with those in FIG. 25, and

Third Modified Example

Figure 30:
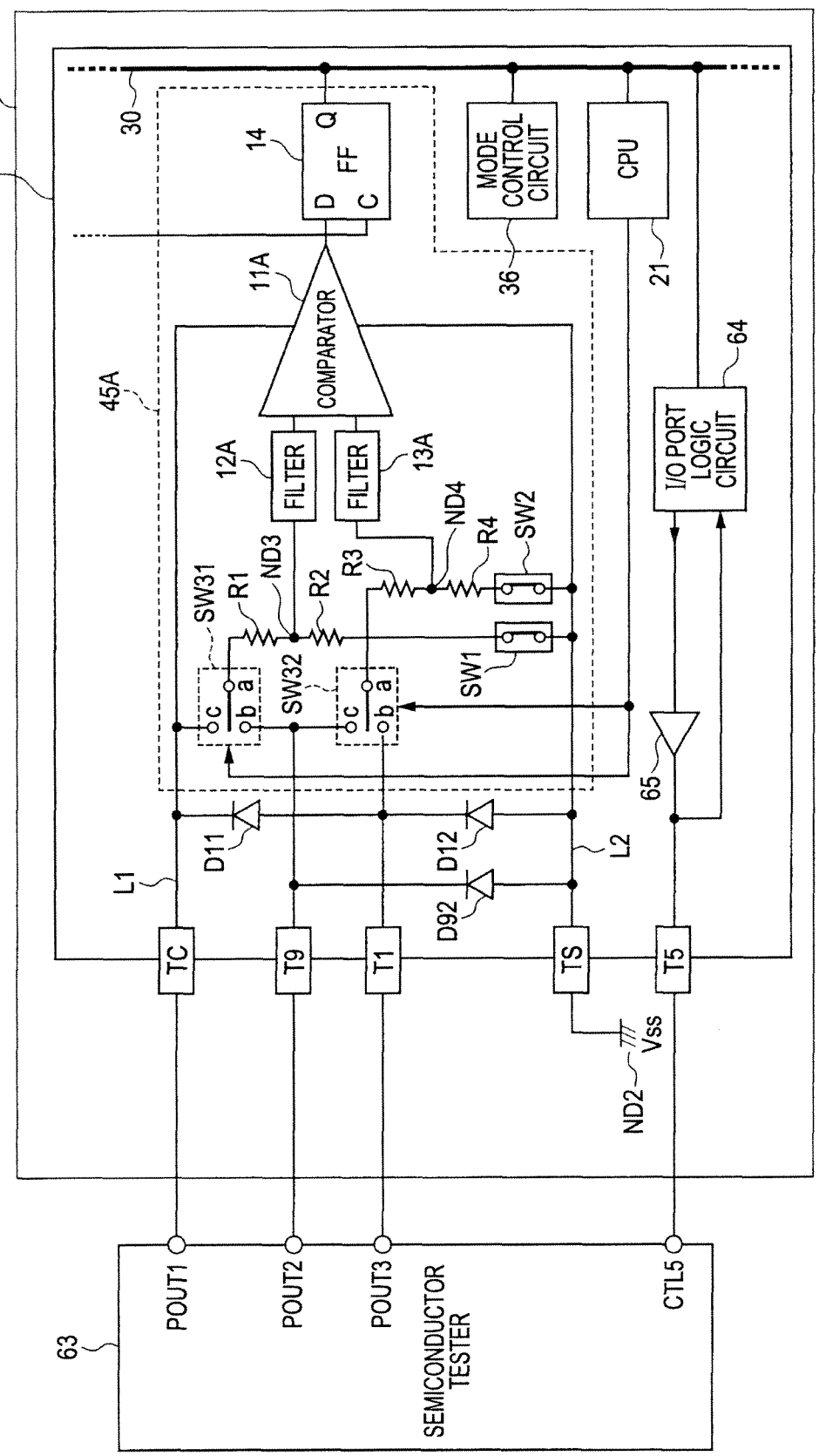
FIG. 30 is a block diagram illustrating a third modified example of the test system.

FIG. 30 is a block diagram illustrating a third modified example of the test system. The test system of FIG. 30 includes a semiconductor device 5, a test board 67 that can install the semiconductor device 5 thereon, and the semiconductor tester 63.

The semiconductor device 5 is equipped with a voltage test unit 45A instead of the voltage test unit 40A of FIG. 24. The voltage test unit 45A is different from the voltage test unit 40A of FIG. 24 in that the voltage test unit 45A further includes the switches SW31 and SW32. The semiconductor device 5 is different from the semiconductor device 3 of FIG. 24 in that the semiconductor device 5 further includes an I/O terminal T9 of an n-channel open drain. A parasitic diode D92 is disposed between the I/O terminal T9 and the ground terminal TS.

The switches SW31 and SW32 are changeover switches each having terminals a, b, and c, and allowing a terminal a to be selectively coupled to one of terminals b and c. The resistive elements R1 and R2 are disposed in series between the terminal a of the switch SW31 and the ground wiring L2, and the resistive elements R3 and R4 are disposed in series between the terminal a of the switch SW32 and the ground wiring L2. The terminal c of the switch SW31 is coupled to the supply wiring L1. The terminal b of the switch SW31 and the terminal c of the switch SW32 are coupled to the I/O terminal T9. The terminal b of the switch SW32 is coupled to the I/O terminal T1.

The semiconductor tester 63 outputs magnitude-variable supply voltages from the power output terminals POUT1, POUT2, and POUT3. The power output terminals POUT1, POUT2, and POUT3 are coupled to the supply terminal TC, the I/O terminal T9, and the I/O terminal T1 of the semiconductor device 5, respectively. The semiconductor tester 63 further communicates with the semiconductor device 5 through the control terminal CTL5. During testing the semiconductor device 5, the CPU 21 operates upon receiving an instruction from the semiconductor tester 63, and a test result from the voltage test unit 45A is output to the semiconductor tester 63.

Figure 31:
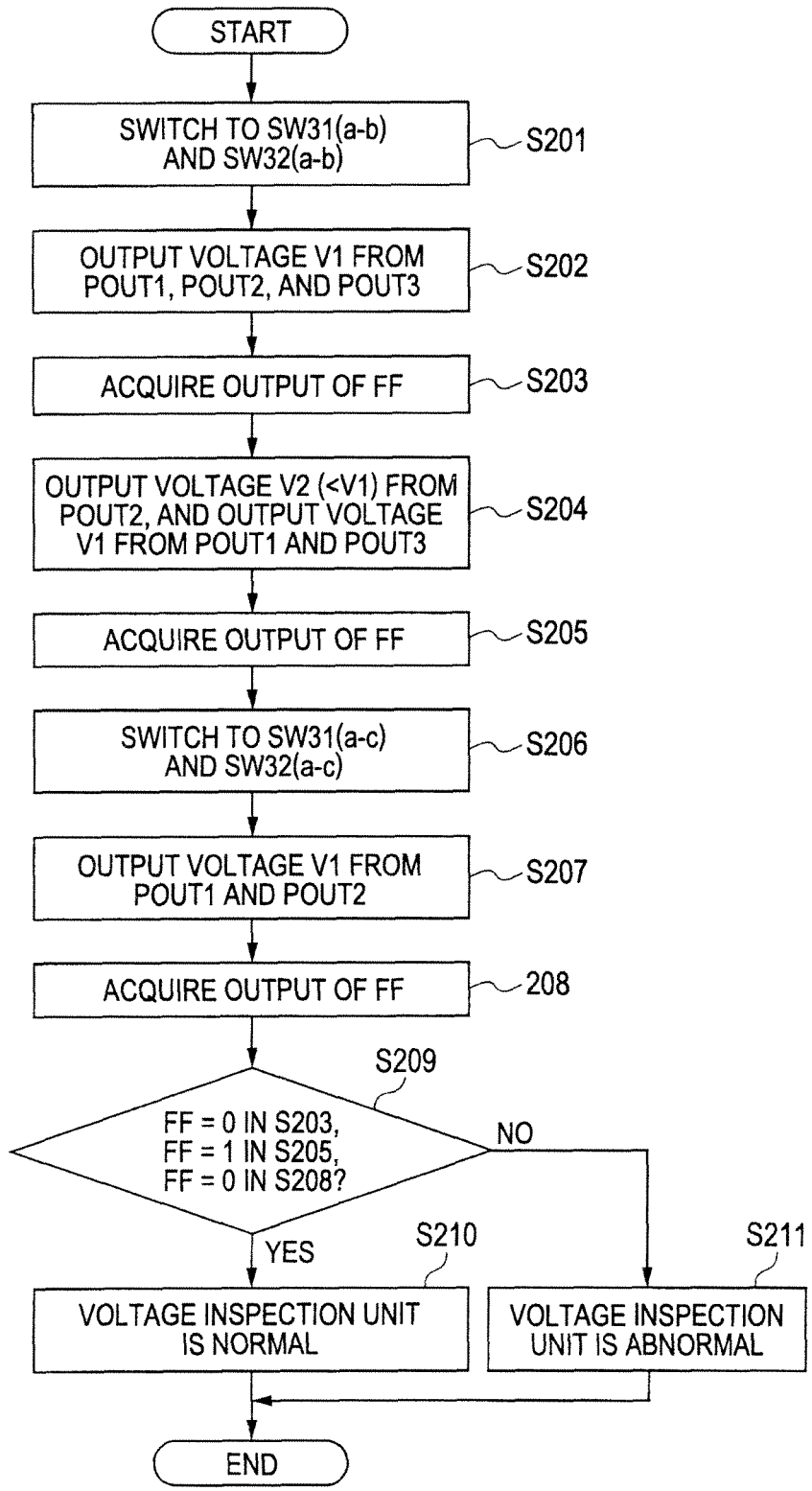
FIG. 31 is a flowchart illustrating a test procedure in the test system of FIG. 30.

FIG. 31 is a flowchart illustrating a test procedure in the test system of FIG. 30. Referring to FIGS. 30 and 31, in Step S201, the CPU 21 switches the switches SW31 and SW32 on the basis of instructions from the semiconductor tester 63, to thereby couple the terminals a and b of the switch SW31, and couple the terminals a and b of the switch SW32.

In subsequent Step S202, the semiconductor tester 63 outputs the voltages V1 (normally equal to supply voltage Vcc) from the power output terminals POUT1, POUT2, and POUT3 to the supply terminal TC and the I/O terminals T9 and T1 of the semiconductor device 5, respectively. The voltage test unit 45A disposed in the semiconductor device 5 compares the voltage of the I/O terminal T9 coupled thereto through the switch SW31 with the voltage of the I/O terminal T1 coupled thereto through the switch SW32. The comparator 11A outputs a signal of the L level ("0") when the voltage of the I/O terminal T9 is equal to the voltage of the I/O terminal T1, and outputs a signal of the H level ("1") when the voltage of the I/O terminal T9 is lower than the voltage of the I/O terminal T1. The output of the comparator 11A is held in the D flip-flop 14.

In subsequent Step S203, the semiconductor tester 63 acquires the output of the D flip-flop 14.

In subsequent Step S204, the semiconductor tester 63 outputs the voltages V1 (normally equal to supply voltage Vcc) from the power output terminals POUT1 and POUT2 to the supply terminal TC and the I/O terminal T1 of the semiconductor device 5, respectively, and outputs the voltage V2 from the power output terminal POUT2 to the I/O terminal T9. The voltage V2 is lower than the voltage V1 by at least the built-in voltage of the diode. The voltage test unit 45A compares the voltage of the I/O terminal T9 coupled thereto through the switch SW31 with the voltage of the I/O terminal T1 coupled thereto through the switch SW32. The comparator 11A outputs a signal of the L level ("0") when the voltage of the I/O terminal T9 is equal to the voltage of the I/O terminal T1, and outputs a signal of the H level ("1") when the voltage of the I/O terminal T9 is lower than the voltage of the I/O terminal T1. The output of the comparator 11A is held in the D flip-flop 14.

In subsequent Step S205, the semiconductor tester 63 acquires the output of the D flip-flop 14.

Subsequently, in Step S206, the CPU 21 switches the switches SW31 and SW32 on the basis of instructions from the semiconductor tester 63, to thereby couple the terminals a and c of the switch SW31, and couple the terminals a and c of the switch SW32.

In subsequent Step S207, the semiconductor tester 63 outputs the voltages V1 (normally equal to supply voltage Vcc) from the power output terminals POUT1 and POUT2 to the supply terminal TC and the I/O terminal T9 of the semiconductor device 5, respectively. The voltage test unit 45A disposed in the semiconductor device 5 compares the voltage of the supply terminal TC coupled thereto through the switch SW31 with the voltage of the I/O terminal T9 coupled thereto through the switch SW32. The comparator 11A outputs a signal of the L level ("0") when the voltage of the supply terminal TC is equal to the voltage of the I/O terminal T9, and outputs a signal of the H level ("1") when the voltage of the supply terminal TC is lower than the voltage of the I/O terminal T9. The output of the comparator 11A is held in the D flip-flop 14.

In subsequent Step S208, the semiconductor tester 63 acquires the output of the D flip-flop 14.

In subsequent Step S209, the semiconductor tester 63 determines whether or not determination conditions that the output of the D flip-flop 14, which is acquired in Step S203, is "0", the output of the D flip-flop 14, which is acquired in Step S250, is "1", and the output of the D flip-flop 14, which is acquired in Step S208, is "0", are satisfied. If the determination conditions are satisfied (yes in Step S209), it is determined that the voltage test unit 45A is normal (Step S210). If the determination conditions are not satisfied (no in Step S209), it is determined that the voltage test unit 45A is abnormal (Step S211).

According to the above test procedure, since the voltage V1 (supply voltage Vcc) is always applied to the comparator 11A from the semiconductor tester 63, the voltage test unit 45A can be tested in the stable operating state.

Fourth Modified Example

Figure 32:
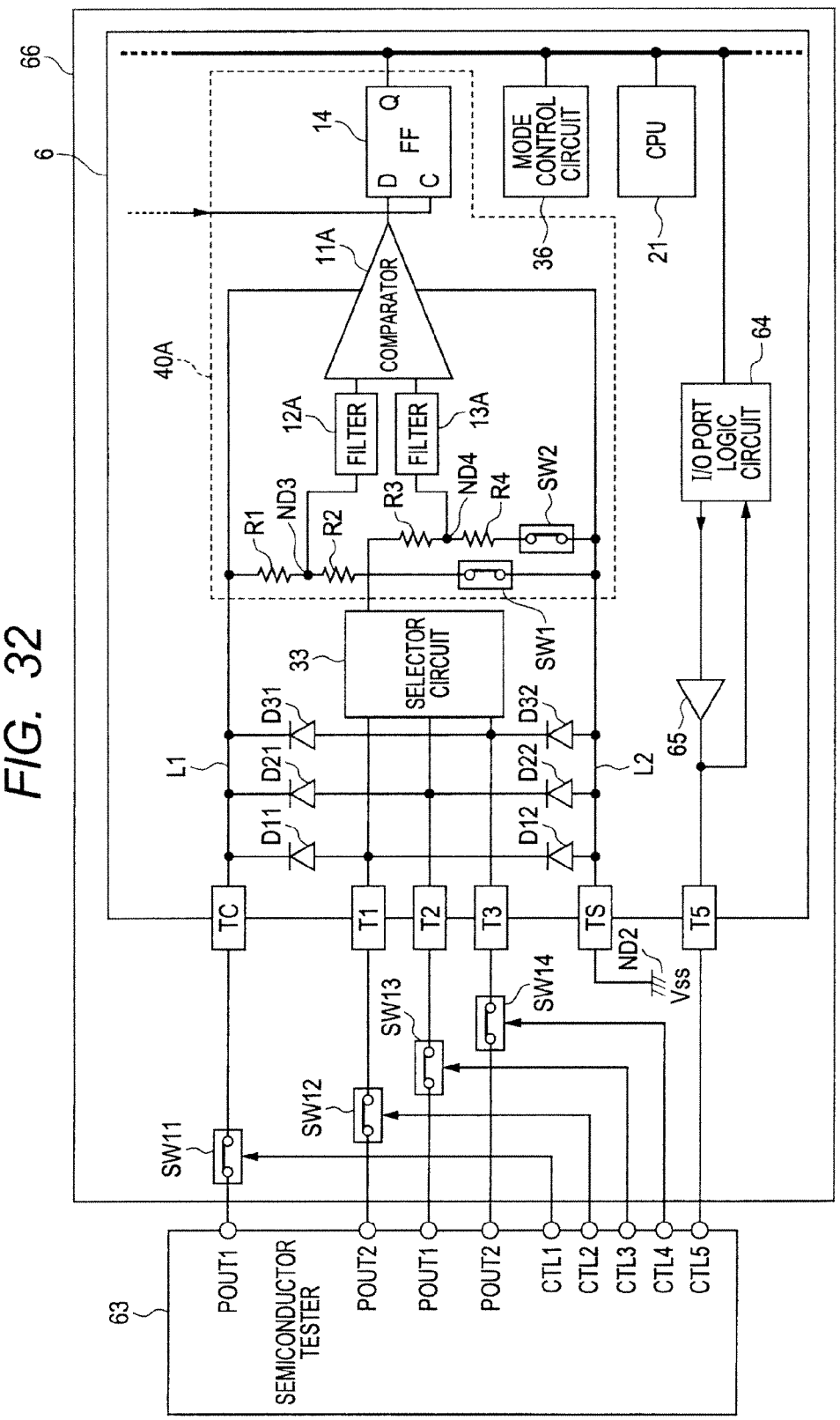
FIG. 32 is a block diagram illustrating a fourth modified example of the test system.

FIG. 32 is a block diagram illustrating a fourth modified example of the test system. The test system of FIG. 32 is different from the test system of FIG. 26 in that the semiconductor device 3 is replaced with a semiconductor device 6. The semiconductor device 6 further includes the selector circuit 33. The selector circuit 33 selects one of the I/O terminals T1 to T3, and outputs a voltage of the selected I/O terminal. The resistive elements R3, R4, and the switch SW2 are coupled in series between the output node of the sele circuit 33 and the ground wiring L2.

The semiconductor tester 63 outputs magnitude-variable supply voltages from the power output terminals POUT1 and POUT2, and outputs signals switchable to the H level and the L level from signal output terminals SOUT1 and SOUT2. The power output terminal POUT1 is coupled to the supply terminal TC of the semiconductor device 6 through the switch SW11 provided on the test board. The power output terminal POUT2 is coupled to the I/O terminal T1 of the semiconductor device 6 through the switch SW12 provided on the test board. The signal output terminal SOUT1 is coupled to the I/O terminal T2 of the semiconductor device 6 through the switch SW13 provided on the test board. The signal output terminal SOUT2 is coupled to the I/O terminal T3 of the semiconductor device 6 through the switch SW14 provided on the test board.

The other configurations in FIG. 32 are identical with those in FIG. 26, and therefore identical or corresponding parts are denoted by the same reference numerals or symbols, and their description will not be repeated.

Figure 33:
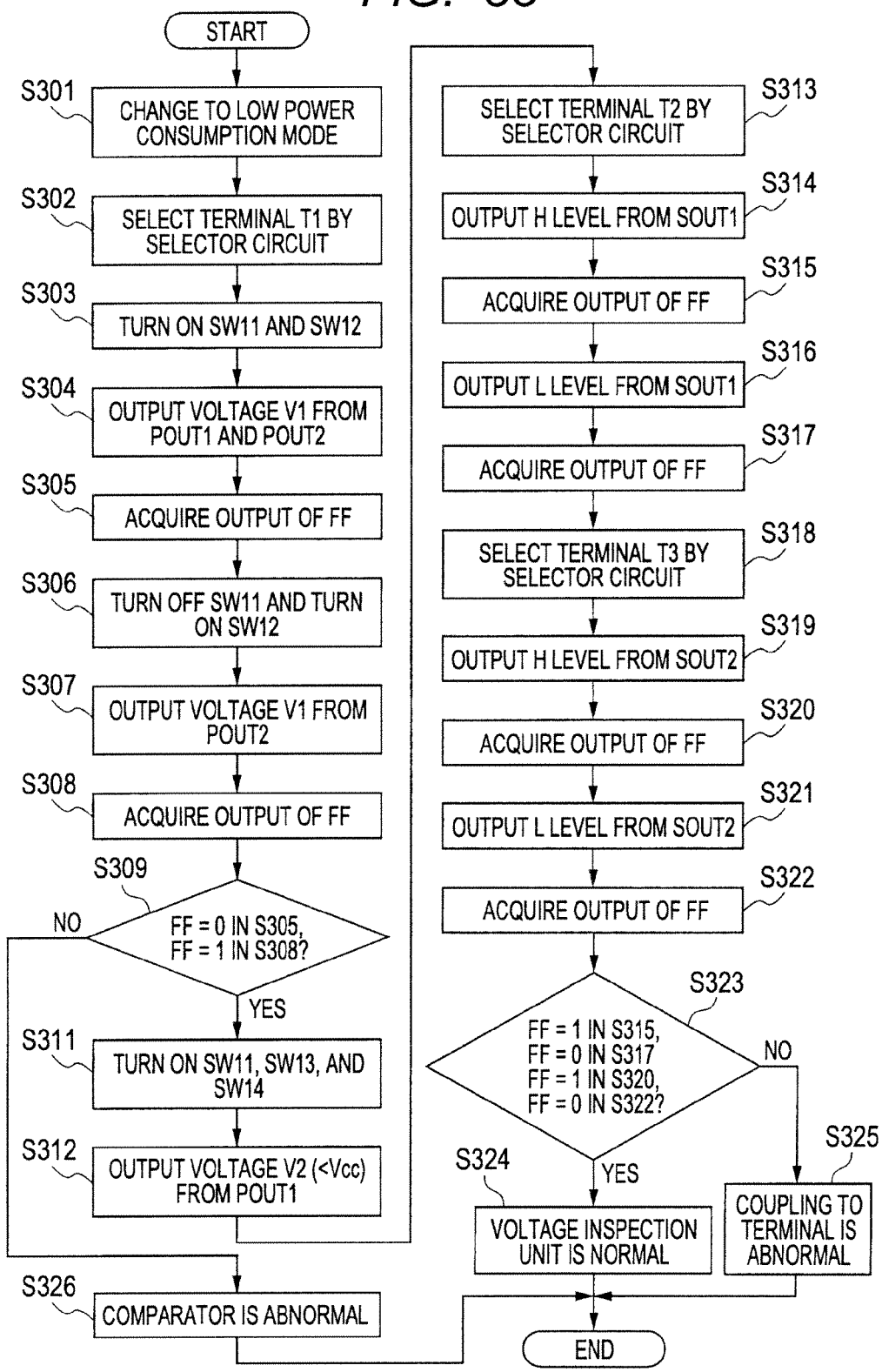
FIG. 33 is a flowchart illustrating a test procedure in the test system of FIG. 32.

FIG. 33 is a flowchart illustrating a test procedure in the test system of FIG. 32. Referring to FIGS. 32 and 33, in Step S301, the mode control circuit 36 switches the operation mode of the semiconductor device 3 to the low power consumption mode so that the semiconductor device 3 operates stably during testing.

In subsequent Step S302, the selector circuit 33 selects the I/O terminal T1 according to an instruction from the CPU 21. The voltage of the I/O terminal T1 is output from the selector circuit 33.

In subsequent Step S303, the semiconductor tester 63 turns on both of the switches SW11 and SW12 on the test board 62.

In subsequent Step S304, the semiconductor tester 63 outputs the voltages V1 (normally equal to supply voltage Vcc) from the power output terminals POUT1 and POUT2 to the supply terminal TC and the I/O terminal T1 of the semiconductor device 6, respectively. The voltage test unit 40A disposed in the semiconductor device 6 compares the voltage of the supply terminal TC with the voltage of the I/O terminal T1 selected by the selector circuit 33. The comparator 11A outputs a signal of the L level ("0") when the voltage of the supply terminal TC is equal to the voltage of the I/O terminal T1, and outputs a signal of the H level ("1") when the voltage of the supply terminal TC is lower than the voltage of the I/O terminal T1. The output of the comparator 11A is held in the D flip-flop 14.

In subsequent Step S305, the semiconductor tester 63 acquires the output of the D flip-flop 14.

In subsequent Step S306, the semiconductor 63 turns on the switch SW11 on the test board 62, and turns on the switch SW12. With this operation, the supply terminal TC of the semiconductor device 6 is opened.

In subsequent Step S307, the semiconductor tester outputs the voltages V1 (normally equal to supply voltage Vcc) from the power output terminal POUT2 to the I/O terminal T1 of the semiconductor device 3. The voltage test unit 40A disposed in the semiconductor device 6 compares the voltage of the supply terminal TC with the voltage of the I/O terminal T1 selected by the selector circuit 33. The comparator 11A outputs a signal of the L level ("0") when the voltage of the supply terminal TC is equal to the voltage of the I/O terminal T1, and outputs a signal of the H level ("1") when the voltage of the supply terminal TC is lower than the voltage of the I/O terminal T1. The output of the comparator 11A is held in the D flip-flop 14.

In subsequent Step S308, the semiconductor tester 63 acquires the output of the D flip-flop 14.

In subsequent Step S309, the semiconductor tester 63 determines whether or not determination conditions that the output of the D flip-flop 14, which is acquired in Step S305, is "0", and the output of the D flip-flop 14, which is acquired in Step S308, is "1", are satisfied. If the determination conditions are satisfied (yes in Step S309), the processing is advanced to Step S311. If the determination conditions are not satisfied (no in Step S309), it is determined that the comparator 11A is abnormal (Step S326), and the processing is completed.

In subsequent Step S311, the semiconductor tester 63 turns on the switches SW11, SW13, and SW14 on the test board 62.

In subsequent Step S312, the semiconductor tester 63 outputs the voltage V2 from the power output terminal POUT1 to the supply terminal TC of the semiconductor device 6. The voltage V2 is lower than the voltage V1 (supply voltage Vcc) by at least the built-in voltage of the diode.

In subsequent Step S313, the selector circuit 33 selects the I/O terminal T2 according to an instruction from the CPU 21. The voltage of the I/O terminal T2 is output from the selector circuit 33.

In subsequent Step S314, the semiconductor tester 63 outputs a signal of the H level (equal to supply voltage Vcc) from the signal output terminal SOUT1 to the supply terminal TC of the semiconductor device 6. The voltage test unit 40A disposed in the semiconductor device 6 compares the voltage of the supply terminal TC with the voltage of the I/O terminal T2 selected by the selector circuit 33. The comparator 11A outputs a signal of the L level ("0") when the voltage of the supply terminal TC is equal to or higher than the voltage of the I/O terminal T2, and outputs a signal of the H level ("1") when the voltage of the supply terminal TC is lower than the voltage of the I/O terminal T2. The output of the comparator 11A is held in the D flip-flop 14.

In subsequent Step S315, the semiconductor tester 63 acquires the output of the D flip-flop 14.

In subsequent Step S316, the semiconductor tester 63 outputs a signal of the L level (equal to ground voltage Vss) from the signal output terminal SOUT1 to the supply terminal TC of the semiconductor device 6. The voltage test unit 40A disposed in the semiconductor device 6 compares the voltage of the supply terminal TC with the voltage of the I/O terminal T2 selected by the selector circuit 33. The comparator 11A outputs a signal of the L level ("0") when the voltage of the supply terminal TC is equal to or higher than the voltage of the I/O terminal 12, and outputs a signal of the H level ("1") when the voltage of the supply terminal TC is lower than the voltage of the I/O terminal 12. The output of the comparator 11A is held in the D flip-flop 14.

In subsequent Step S317, the semiconductor tester 63 acquires the output of the D flip-flop 14.

In subsequent Step S318, the selector circuit 33 selects the I/O terminal 13 according to an instruction from the CPU 21. The voltage of the I/O terminal 13 is output from the selector circuit 33.

In subsequent Step S319, the semiconductor tester 63 outputs a signal of the H level (equal to supply voltage Vcc) from the signal output terminal SOUT2 to the supply terminal TC of the semiconductor device 6. The voltage test unit 40A disposed in the semiconductor device 6 compares the voltage of the supply terminal TC with the voltage of the I/O terminal T3 selected by the selector circuit 33. The comparator 11A outputs a signal of the L level ("0") when the voltage of the supply terminal TC is equal to or higher than the voltage of the I/O terminal T3, and outputs a signal of the H level ("1") when the voltage of the supply terminal TC is lower than the voltage of the I/O terminal T3. The output of the comparator 11A is held in the D flip-flop 14.

In subsequent Step S320, the semiconductor tester 63 acquires the output of the D flip-flop 14.

In subsequent Step S321, the semiconductor tester 63 outputs a signal of the L level (equal to ground voltage Vss) from the signal output terminal SOUT1 to the supply terminal TC of the semiconductor device 6. The voltage test unit 40A disposed in the semiconductor device 6 compares the voltage of the supply terminal TC with the voltage of the I/O terminal T3 selected by the selector circuit 33. The comparator 11A outputs a signal of the L level ("0") when the voltage of the supply terminal TC is equal to or higher than the voltage of the I/O terminal T3, and outputs a signal of the H level ("1") when the voltage of the supply terminal TC is lower than the voltage of the I/O terminal T3. The output of the comparator 11A is held in the D flip-flop 14.

In subsequent Step S323, the semiconductor tester 63 acquires the output of the D flip-flop 14.

In subsequent Step S323, the semiconductor tester 63 determines whether or not determination conditions that the output of the D flip-flop 14, which is acquired in Step S315, is "1", the output of the D flip-flop 14, which is acquired in Step S317, is "0", the output of the D flip-flop 14, which is acquired in Step S320, is "1", and the output of the D flip-flop 14, which is acquired in Step S322, is "0", are satisfied. If the determination conditions are satisfied (yes in Step S323), it is determined that the voltage test unit 40A is normal (Step S324). If the determination conditions are not satisfied (no in Step S323), it is determined that the coupling of the I/O terminals T2 and T3 is abnormal (Step S325).

According to the above test procedure, it is first determined whether the comparator 11A is normal or not in Steps S302 to S309. Thereafter, it is determined whether the coupling to the respective I/O terminals is normal or not. The determination is conducted by merely switching the level of the input signal to the H level and the L level, and therefore the semiconductor device can be tested at a higher speed.

The embodiments of the invention disclosed this time should be considered to be exemplary in all respects and not limitative. The scope of the invention is not defined by the foregoing description but by the claims. The invention is intended to include all the modifications that are equivalent in significance and scope to the claims.

What is claimed is:

1. A semiconductor device, comprising:
   a supply terminal that receives a supply voltage from an outside and supplies the supply voltage to a power supply line;
   a ground terminal that receives a ground voltage from the outside;
   a first I/O terminal that conducts a logical input signal from the outside;
   a first diode that is disposed between the supply terminal and the first I/O terminal so that the supply terminal is located on a cathode side and the first I/O terminal is located on an anode side; and
   a determination unit that compares voltages of the power supply line and the first I/O terminal, and outputs an instruction signal indicating a voltage level of the supply terminal lowering when the voltage of the power supply line is lower than the voltage of the first I/O terminal in receiving a logical high signal.

2. The semiconductor device according to claim 1, wherein the determination unit includes:
   a first voltage divider that divides a voltage applied between the power supply line and the ground terminal, and outputs a first divided voltage obtained by voltage division;
   a second voltage divider that divides a voltage applied between the first I/O terminal and the ground terminal, and outputs a second divided voltage obtained by voltage division; and
   a first comparator that is driven by the voltage applied between the power supply line and the ground terminal, and compares the first divided voltage with the second divided voltage, and
   wherein a division ratio of the first and second voltage dividers is set so that the first divided voltage is higher than the second divided voltage when the supply voltage is applied to both of the supply terminal and the first I/O terminal, and the first divided voltage is lower than the second divided voltage when the supply terminal is opened, and the supply voltage is applied to the first I/O terminal.

3. The semiconductor device according to claim 1, wherein the determination unit includes a first comparator that is driven by a voltage applied between the first I/O terminal and the ground terminal, and compares the voltage of the power supply line with the voltage of the first I/O terminal, and
   wherein the first comparator outputs a signal of a first logic level as the instruction signal when the voltage of the power supply line is lower than the voltage of the first I/O terminal, and the first comparator outputs a signal of a second logic level when the voltage of the power supply line is not lower than the voltage of the first I/O terminal.

4. The semiconductor device according to claim 1, wherein the determination unit includes:
   a first voltage divider that divides a voltage applied between the power supply line and the ground terminal, and outputs a first divided voltage obtained by voltage division;
   a second voltage divider that divides a voltage applied between the first I/O terminal and the ground terminal, and outputs a second divided voltage obtained by voltage division;
   a first comparator that is driven by the voltage applied between the power supply line and the ground terminal, and compares the first divided voltage with the second divided voltage;
   a third voltage divider that divides the voltage applied between the power supply line and the ground terminal, and outputs a third divided voltage obtained by voltage division;
   a fourth voltage divider that divides a voltage applied between the power supply line and the second I/O terminal, and outputs a fourth divided voltage obtained by voltage division; and
   a second comparator that is driven by the voltage applied between the power supply line and the ground terminal, and compares the third divided voltage with the fourth divided voltage,
   wherein a division ratio of the first and second voltage dividers is set so that the first divided voltage is higher than the second divided voltage when the supply voltage is applied to both of the power supply line and the first I/O terminal, and the first divided voltage is lower than the second divided voltage when the supply terminal is opened, and the supply voltage is applied to the first I/O terminal, and wherein a division ratio of the third and fourth voltage dividers is set so that the third divided voltage is higher than the fourth divided voltage when the ground voltage is applied to both of the ground terminal and the second I/O terminal, and the third divided voltage is lower than the fourth divided voltage when the ground terminal is opened, and the ground voltage is applied to the second I/O terminal.

5. The semiconductor device according to claim 1, wherein the determination unit includes:
   a first comparator that is driven by a voltage applied between the first and second I/O terminals, and compares the voltage of the power supply line with the voltage of the first I/O terminal; and
   a second comparator that is driven by the voltage applied between the first and second I/O terminals, and compares the voltage of the second I/O terminal with the voltage of the ground terminal,
   wherein the first comparator outputs a signal of a first logic level as the instruction signal when the voltage of the power supply line is lower than the voltage of the first I/O terminal, and the first comparator outputs a signal of a second logic level when the voltage of the power supply line is not lower than the voltage of the first I/O terminal, and
   wherein the second comparator outputs the signal of the first logic level when the voltage of the ground terminal is lower than the voltage of the second I/O terminal, and the second comparator outputs the signal of the second logic level when the voltage of the ground terminal is not lower than the voltage of the second I/O terminal.

6. The semiconductor device according to claim 5, wherein the determination unit further includes an OR circuit that ORs an output of the first comparator and an output of the second comparator.

7. A semiconductor device, comprising:
   a supply terminal that receives a supply voltage from an outside;
   a ground terminal that receives a ground voltage from the outside;
   a first I/O terminal that conducts at least one of input and output of a signal with respect to the outside;
   a first diode that is disposed between the supply terminal and the first I/O terminal so that the supply terminal is located on a cathode side and the first I/O terminal is located on an anode side; and
   a determination unit that determines whether or not a voltage of the supply terminal is lower than a voltage of the first I/O terminal when a signal of high level equal to the supply voltage is input to the first I/O terminal,
   wherein the determination unit includes:
      a first voltage divider that divides a voltage applied between the supply terminal and the ground terminal, and outputs a first divided voltage obtained by voltage division;
      a second voltage divider that divides a voltage applied between the first I/O terminal and the ground terminal, and outputs a second divided voltage obtained by voltage division; and
      a first comparator that is driven by the voltage applied between the supply terminal and the ground terminal, and compares the first divided voltage with the second divided voltage, and wherein a division ratio of the first and second voltage dividers is set so that the first divided voltage is higher than the second divided voltage when the supply voltage is applied to both of the supply terminal and the first I/O terminal, and the first divided voltage is lower than the second divided voltage when the supply terminal is opened, and the supply voltage is applied to the first I/O terminal.

8. A semiconductor device, comprising:
   a supply terminal that receives a supply voltage from an outside;
   a ground terminal that receives a ground voltage from the outside;
   a first I/O terminal that conducts at least one of input and output of a signal with respect to the outside;
   a first diode that is disposed between the supply terminal and the first I/O terminal so that the supply terminal is located on a cathode side and the first I/O terminal is located on an anode side; and
   a determination unit that determines whether or not a voltage of the supply terminal is lower than a voltage of the first I/O terminal when a signal of high level equal to the supply voltage is input to the first I/O terminal,
   wherein the determination unit includes:
      a first voltage divider that divides a voltage applied between the supply terminal and the ground terminal, and outputs a first divided voltage obtained by voltage division;
      a second voltage divider that divides a voltage applied between the first I/O terminal and the ground terminal, and outputs a second divided voltage obtained by voltage division;
      a first comparator that is driven by the voltage applied between the supply terminal and the ground terminal, and compares the first divided voltage with the second divided voltage;
      a third voltage divider that divides the voltage applied between the supply terminal and the ground terminal, and outputs a third divided voltage obtained by voltage division;
      a fourth voltage divider that divides a voltage applied between the supply terminal and the second I/O terminal, and outputs a fourth divided voltage obtained by voltage division; and
      a second comparator that is driven by the voltage applied between the supply terminal and the ground terminal, and compares the third divided voltage with the fourth divided voltage,
   wherein a division ratio of the first and second voltage dividers is set so that the first divided voltage is higher than the second divided voltage when the supply voltage is applied to both of the supply terminal and the first I/O terminal, and the first divided voltage is lower than the second divided voltage when the supply terminal is opened, and the supply voltage is applied to the first I/O terminal, and
   wherein a division ratio of the third and fourth voltage dividers is set so that the third divided voltage is higher than the fourth divided voltage when the ground voltage is applied to both of the ground terminal and the second I/O terminal, and the third divided voltage is lower than the fourth divided voltage when the ground terminal is opened, and the ground voltage is applied to the second I/O terminal.

* * * * *